United States Patent [19]
Nambu et al.

[11] Patent Number: 5,398,201
[45] Date of Patent: Mar. 14, 1995

[54] BIT-LINE DRIVE CIRCUIT FOR A SEMICONDUCTOR MEMORY

[75] Inventors: Hiroaki Nambu, Hachioji; Noriyuki Homma, Kodaira; Kunihiko Yamaguchi, Sayama; Hisayuki Higuchi; Kazuo Kanetani, both of Kokubunji; Youji Idei, Asaka; Ken'ichi Ohata; Yoshiaki Sakurai, both of Kokubunji; Masanori Odaka, Kodaira; Goro Kitsukawa, Tokyo, all of Japan

[73] Assignees: Hitachi, Ltd.; Hitachi Device Engineering Co., Ltd., Tokyo, Japan

[21] Appl. No.: 53,330

[22] Filed: Apr. 28, 1993

Related U.S. Application Data

[63] Continuation of Ser. No. 503,765, Apr. 3, 1990, abandoned.

[30] Foreign Application Priority Data

Apr. 5, 1989 [JP] Japan .................. 1-84863
Jul. 19, 1989 [JP] Japan .................. 1-184691
Aug. 16, 1989 [JP] Japan .................. 1-210083

[51] Int. Cl.[6] .............................................. G11C 11/34
[52] U.S. Cl. .................................. 365/177; 365/225.6
[58] Field of Search .................... 365/63, 177, 225.6, 365/190, 203

[56] References Cited

U.S. PATENT DOCUMENTS

| | | | |
|---|---|---|---|
| 4,785,422 | 11/1988 | Berndt et al. | 365/177 |
| 4,961,168 | 10/1990 | Tran | 365/177 |
| 5,091,879 | 2/1992 | Tran | 365/177 |
| 5,099,452 | 3/1992 | Yamakoshi et al. | 365/190 |
| 5,111,435 | 5/1992 | Miyamoto | 365/190 |

FOREIGN PATENT DOCUMENTS

| | | |
|---|---|---|
| 0096529 | 8/1981 | Japan . |
| 0132490 | 7/1984 | Japan . |
| 0278098 | 12/1986 | Japan . |
| 0293789 | 11/1988 | Japan . |
| 0101697 | 4/1990 | Japan . |

OTHER PUBLICATIONS

Tran et al, "An 8ns BiCMOS 1Mb ECL SRAM with a Configurable Memory Array Size", IEEE International Solid–State Circuit Conference, Feb. 15, 1989, pp. 36–37.

*Primary Examiner*—Jack B. Harvey
*Assistant Examiner*—Michael A. Whitfield
*Attorney, Agent, or Firm*—Antonelli, Terry, Stout & Kraus

[57] ABSTRACT

A circuit technique suitable to attain a high speed of a memory which is constructed in a manner such that memory cells include a field effect transistor and peripheral circuits include a bipolar transistor and a field effect transistor. According to the invention, a bipolar transistor whose collector is connected to a differential amplifier and which supplies a current to the differential amplifier in accordance with a signal which is inputted to a base or an emitter is added, and a bipolar transistor to supply a current only when writing to bit lines is connected. According to the invention, a high speed of the access time when information is read out by switching the selection bit line is accomplished. Further, the charge/discharge time of the bit line when information is written is reduced and a high speed of the writing time can be also accomplished. The improvement of the drivers of word lines and bit lines is also disclosed and a semiconductor memory which can operate at a high speed as a whole semiconductor memory can be realized.

10 Claims, 24 Drawing Sheets

MEMORY CELL & SENSE CIRCUIT

MEMORY CELL & SENSE CIRCUIT

MEMORY CELL & SENSE CIRCUIT

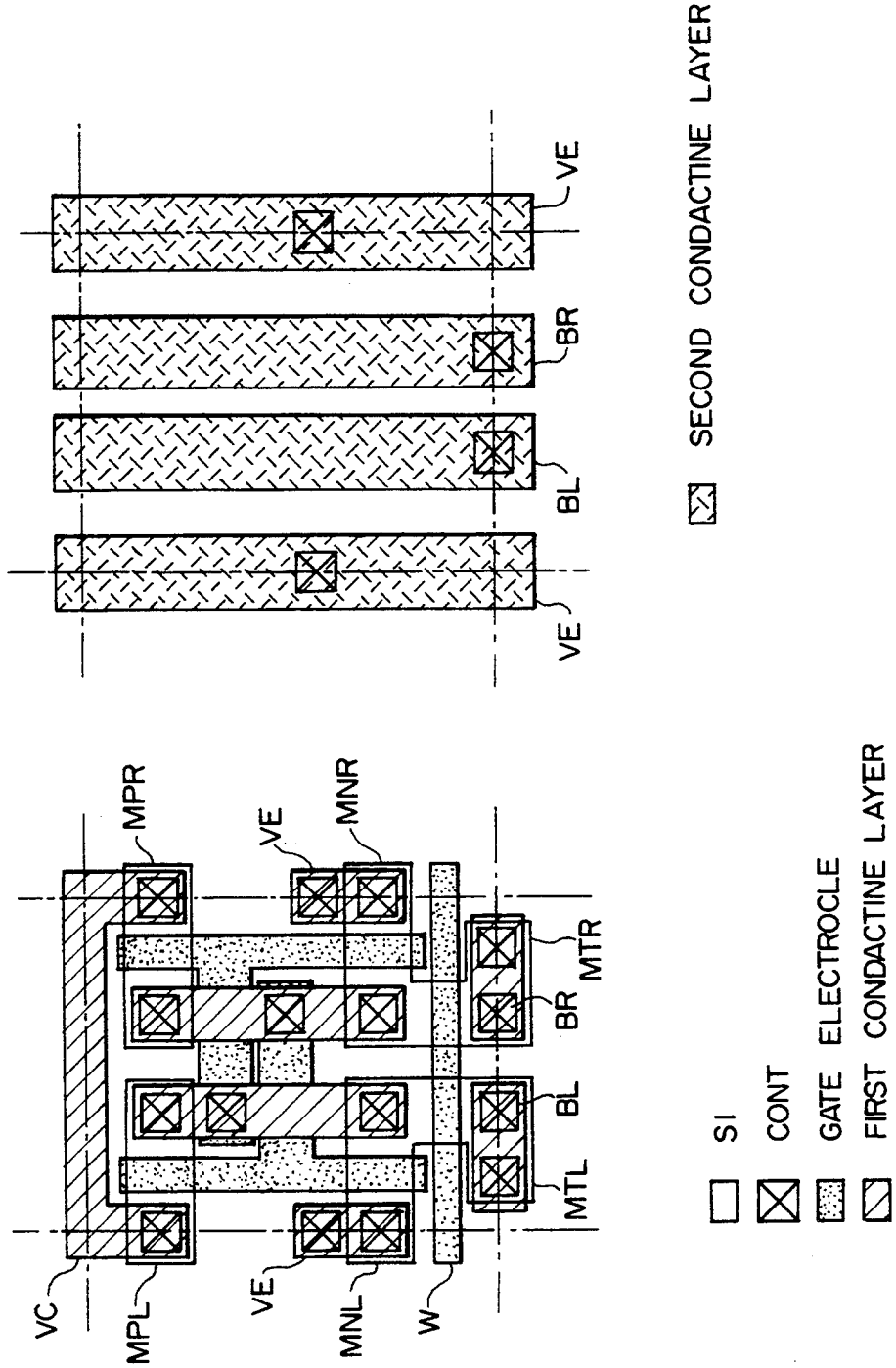

BIT-LINE DRIVE CIRCUIT FOR A SEMICONDUCTOR MEMORY

This application is a continuation of application Ser. No. 503,765, filed on Apr. 3, 1990, now abandoned.

BACKGROUND OF THE INVENTION

The present invention relates to a semiconductor memory and, more particularly, to a circuit technology suitable to attain a high speed memory having memory cells constructed by including field effect transistors (FET).

In recent years, to attain both high density and high speed for a memory, a number of circuits have been proposed using both field effect transistors and bipolar transistors. As an example of such circuits, there has been known a circuit disclosed in the paper entitled, "An 8 ns BiCMOS 1 Mb ECL SRAM with a Configurable Memory Array Size", ISSCC Digest of Technical Papers, pp. 36-37, 1989. According to the above circuit, the memory cell is constructed by a metal-insulator-silicon (MIS) field effect transistor suitable to attain a high density, a differential amplifier to detect a voltage of a bit line is constructed by a bipolar transistor whose base is connected to the bit line, and a circuit to supply a charge current to the bit line is constructed by a bipolar transistor whose emitter is connected to the bit line through a resistor. That is, the area of the memory cell is reduced by the MIS FET suitable to attain a high density and the sensing time of the bit line voltage and the charge time of the bit line are reduced by the bipolar transistor suitable to attain a high speed. However, since the circuit to activate the differential amplifier to detect the voltage of the bit line and the circuit to supply the discharge current to the bit line are constructed by the MIS field effect transistors, there is a limitation to reduce the switching time which is required to activate the differential amplifier and the discharge time of the bit line.

SUMMARY OF THE INVENTION

The present inventors have found out the following problems as the result of the examination of the above conventional technique. To explain the problems, a circuit diagram of the conventional technique is shown in FIG. 2. FIG. 2 is a circuit diagram of a memory cell of a semiconductor memory and its peripheral circuits. In the diagram, $MC_{11}$ to $MC_{22}$ denote memory cells; $W_1$ and $W_2$ indicate word lines; $BL_1$, $BR_1$, $BL_2$, and $BR_2$ bit lines; $VYIN_1$ and $VYIN_2$ bit line select signals; and D, D', DI, and DI' read/write control signals. When the memory cell $MC_{11}$ is selected and information is read out, the word line $W_1$ is driven to a high voltage in order to turn on transistors MTL and MTR, the bit line select signal $VYIN_1$ is driven to a high voltage in order to turn on transistors MRL, MRR, and MR, and the read/write control signals D and D' are driven to a low voltage in order to turn off transistor MDL and MDR and the read/write control signals DI and DI' are driven to a high voltage. When a transistor MNL in the memory cell $MC_{11}$ is turned on, a cell current Icell flows from a transistor QYL to a VEE through a resistor REL and the transistors MTL and MNL. Therefore, the current flowing to the transistor QYL is the sum of the Icell and a current I (MRL) flowing to the transistor MRL, that is, Icell+I (MRL).

Thus, a base-emitter voltage VBE (QYL) of the transistor QYL is $$VBE(QYL) = (nkT/q) \cdot \ln[\{Icell + I(MRL)\}/I_0],$$

where
k: Boltzmann's constant = $1.38 \times 10^{-23}$ J/K
q: electronic charge = $1.602 \times 10^{-19}$ C
n: emission coefficient (e.g., n=1.05)
T: absolute temperature, kelvins (e.g., T=323.15 K)
$I_0$: emitter-base saturation current.

On the other hand, a voltage V (REL) of the resistor REL is $$V(REL) = REL \cdot \{Icell + I(MRL)\}.$$

On the other hand, the current flowing to a transistor QYR is only the current I (MRR) (=I (MRL)) flowing to the MRR. Therefore, a base-emitter voltage VBE (QYR) of the QYR is $$VBE(QYR) = (nkT/q) \cdot \ln[I(MRL)/I_0].$$

A voltage V (RER) of a resistor RER (=REL) is V (RER) = REL·I (MRL).

Therefore, a voltage difference $\Delta VB$ between the bit lines $BL_1$ and $BR_1$ is $$\begin{aligned}
\Delta VB &= VBE(QYL) + V(REL) - VBE(QYR) - V(RER) \\
&= (nkT/Q) \cdot \ln[\{Icell + I(MRL)\}/I(MRL)] + \\
&\quad REL \cdot Icell.
\end{aligned}$$

Now, since $VYIN_1$ is set to the high voltage and the transistor MR is turned on, the differential amplifier comprising the transistors QRL and QRR is activated. Thus, the differential amplifier detects the voltage difference $\Delta VB$ and outputs data to common data lines CDL and CDR. On the other hand, for the bit line which is not selected, since the bit line select signal $VYIN_2$ is set to the low voltage and the MR in a block $S_2$ is turned off, the differential amplifier in $S_2$ is not activated and does not output any data to the common data lines CDL and CDR. Therefore, since only the data of the cell $MC_{11}$ is outputted to the common data lines CDL and CDR, by detecting such data, information of the cell $MC_{11}$ can be read out.

Then, when the memory cell $MC_{11}$ is selected and information is written, first, the word line $W_1$ is driven to the high voltage and the bit line select signal $VYIN_1$ is driven to the high voltage in a manner similar to the reading mode. After that, in accordance with the write information, either one of the read/write control signals D and D' is driven to the high voltage and either one of the read/write control signals DI and DI' is driven to the low voltage. When the transistor MNL in the cell $MC_{11}$ is turned on, if the D' is driven to the high voltage and the DI' is driven to the low voltage, the bit line $BR_1$ changes to the low voltage and the gate voltage of the transistor MNL is set to the low voltage. Thus, the transistor MNL is switched from the ON state to the OFF state and the information in the cell is rewritten.

However, the above conventional example has the following two problems as will be explained hereinbelow.

The first problem will now be explained. The first problem occurs when the select bit line is switched and information is read out. That is, the information in the cell $MC_{11}$ is first read out. Then, in order to read out information in the cell $MC_{12}$ by switching the select bit line, $VYIN_1$ is driven to the low voltage and $VYIN_2$ is driven to the high voltage. At this time, the transistor MR in a block $S_1$ is switched from the ON state to the OFF state and the MR in $S_2$ is switched from the OFF state to the ON state. Therefore, the differential amplifier in $S_1$ is not activated, the differential amplifier in $S_2$ is activated, and the data of the cell $MC_{12}$ is outputted to the common data lines CDL and CDR. However, generally, since the switching time of the MIS FET is as slow as about 1 nsec, it takes an extremely long time until the transistor MR is switched from the OFF state to the ON state and the differential amplifier is switched to the activated state. Therefore, there is a problem such that the access time when information is read out by switching the select bit line is remarkably slow.

The second problem will now be described. The second problem occurs when information is written. That is, when the memory cell $MC_{11}$ is selected and information is written, as mentioned above, in accordance with the write information, it is necessary to discharge either one of the bit lines $BL_1$ and $BR_1$ and to drive the bit line to the low voltage. Therefore, when writing, the read/write control signal D or D' is set to the high voltage and transistor MDL or MDR is switched from OFF to ON. However, since the switching time of the MIS FET is so slow as to be about 1 nsec, it takes a fairly long time to discharge the bit line and to drive the bit line to the low voltage. Thus, there is a problem such that the writing time is extremely slow.

As can be seen from the description made above with reference to FIG. 2, it can be seen that the discharge time of the bit lines cause the problems. However, for instance, in the case where, in FIG. 2, the N channel MIS FET is replaced by a P channel MIS FET and the NPN bipolar transistor is replaced by a PNP bipolar transistor and all of the voltage relations are inverted, the charge time of the bit lines causes the problems.

To solve such problems, the invention uses the following two kinds of means. In the first means there is added a bipolar transistor whose collector is connected to the differential amplifier and which supplies a current to the differential amplifier in accordance with a signal which is inputted to its base or its emitter, and wherein a signal which is inputted to the base is lower level than a signal which is inputted to the differential amplifier to avoid the saturation of the added bipolar transistor. The second means is one in which a bipolar transistor to supply a current only in the writing mode is connected to the bit line and wherein a signal is inputted to the base of the connected bipolar transistor is lower level than the read/write control signal DI and DI' to avoid the saturation of the transistor.

When the above means are used, generally, since the switching time of the non-saturated bipolar transistor is as fast as about 0.5 nsec, it takes only an extremely short time to switch the differential amplifier to the activated state, so that the access time which is required when information is read out by switching the select bit line is extremely fast. In a manner similar to the above, since only a fairly short time is required to discharge the bit line and to drive the bit line to the low voltage, the writing time is remarkably fast.

In another conventional discharge circuit shown in FIG. 13, when the word line is set to the high voltage, a current is always supplied to the word line. Thus, there is also a problem such that the voltage of the selected word line decreases due to an increase in base-emitter voltage of a transistor QW and an increase in voltage drop at a load RCL by an increase in base current of the transistor QW.

The present invention is accomplished by a semiconductor circuit comprising: a bipolar transistor whose emitter is connected to a current source and whose collector is connected to a load; and a switch in which one end is connected to the load and the other end is connected to the base of the transistor, wherein the semiconductor circuit is characterized in that a current flowing through the load is controlled by controlling the on/off operation of the switch.

Further, according to other conventional bit line driving current switch circuits shown in FIGS. 19A and 19B, it is necessary to use pnp transistors and there are the following problems:

① The processes become complicated; and
② It is difficult to realize a pnp transistor of a high performance.

The present invention comprises: current switch circuits each for switching an output current in accordance with an input signal; logic circuits each for generating either a high voltage or a low voltage in accordance with the input signal; level shift circuits each of which receives an output voltage of the logic circuit and in each of which the output voltage V satisfies the following equation:

$$\partial V/\partial VEE = 1 (VEE: \text{power source voltage});$$

and a current source of the current Miller type for switching an output current by the output voltage from the level shift circuit.

It is an object of the invention to solve the problems of the conventional techniques mentioned above.

Another object of the invention is to attain a high speed of the access time when information is read out by switching a select bit line.

Still another object of the invention is to reduce the charge/discharge time of a bit line when information is written and to attain a high speed of the writing time.

Another object of the invention is to provide a semiconductor circuit which can prevent the voltage of a selected word line from dropping.

Yet another object of the invention is to provide a current switch circuit which does not use any pnp transistor, that is, which can be easily realized by the existing processing technique and which is suitable to attain a high speed and a low power source voltage.

These and other objects and many of the attendant advantages of this invention will be readily appreciated as the same becomes better understood by reference to the following detailed description when considered in connection with the accompanying drawings.

BRIEF DESCRIPTION OF THE DRAWINGS

FIG. 10 is a diagram showing a layout of semiconductor memories showing the tenth embodiment of the invention;

DETAILED DESCRIPTION OF THE INVENTION

The present invention will be described hereinbelow by use of embodiments. Embodiments 1 to 11 mainly relate to whole constructions of semiconductor memories and read/write circuits. Embodiments 12 to 15 mainly relate to word line discharge circuits of semiconductor memories and word line drivers. Embodiments 16 to 21 mainly relate to bit line current switch circuits of semiconductor memories and bit line drivers. The above embodiments can be also combined.

Embodiment 1

Figure 3A:
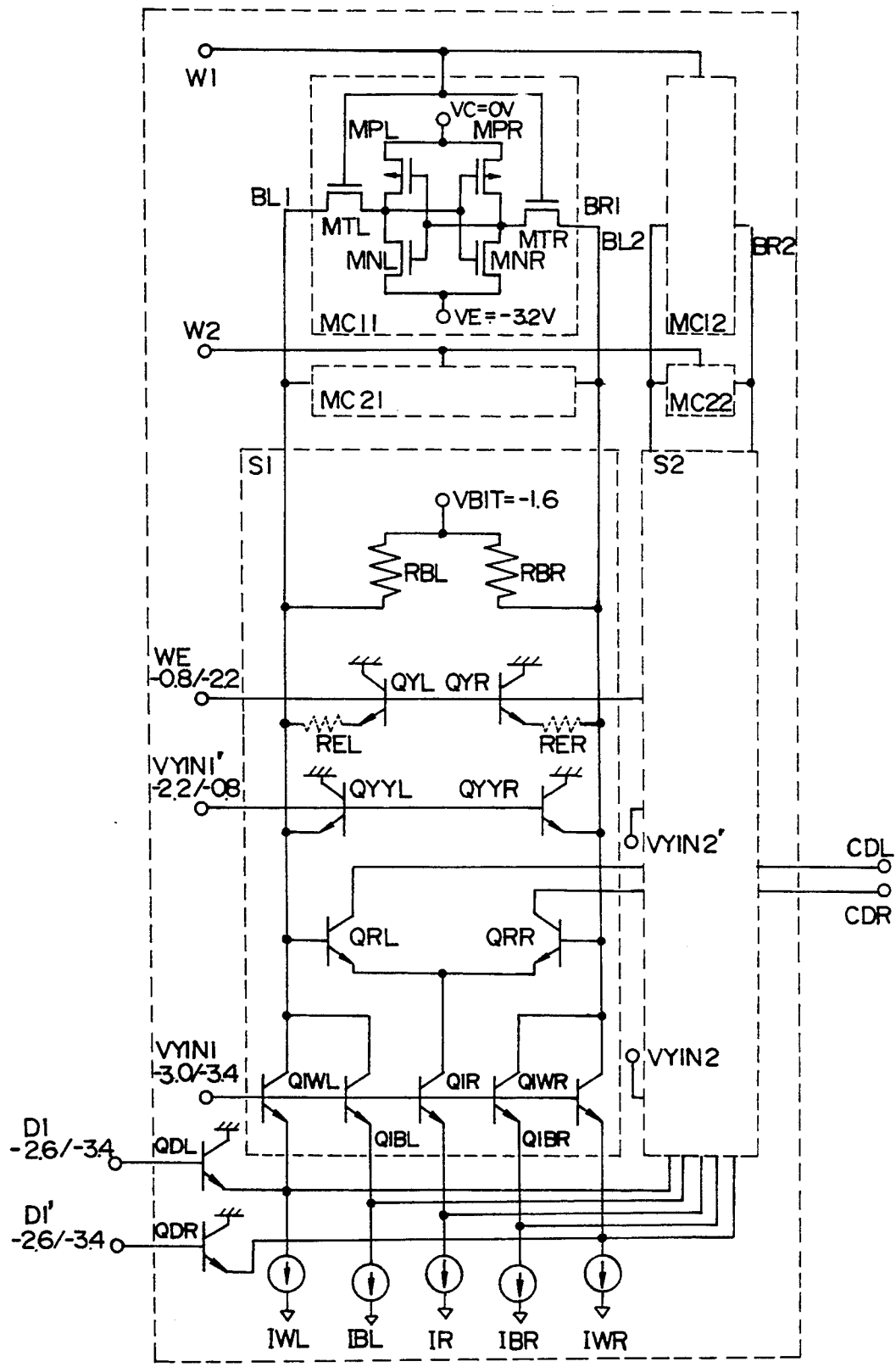
FIGS. 3A and 3B are circuit diagrams showing the first and second embodiments of the invention.

FIG. 3A is a diagram showing the first embodiment of the invention. FIG. 3A is a circuit diagram of a memory cell of a semiconductor memory and its peripheral circuits. In the diagram, $MC_{11}$ to $MC_{22}$ denote the memory cells; $W_1$ and $W_2$ the word lines; $BL_1$, $BR_1$, $BL_2$, and $BR_2$ the bit lines; $VYIN_1$, $VYIN_1'$, $VYIN_2$, and $VYIN_2'$ the bit line select signals; and WE, DI, and DI' the read/write control signals. Numerical values in the diagram show an example of voltage values of power sources or signals. For instance, $-3.0/-3.4$ of the bit line select signal $VYIN_1$ denote that the selection level is set to $-3.0$ V and the non-selection level is set to $-3.4$ V. $-0.8/-2.2$ of the read/write control signal WE denote that the reading level is set to $-0.8$ V and the writing level is set to $-2.2$ V. In the diagram, when the memory cell $MC_{11}$ is selected and information is read out, the word line $W_1$ is driven to the high voltage in order to turn on the transistors MTL and MTR, the bit line select signal $VYIN_1$ is driven to the high voltage and the read/write control signal WE is driven to the high voltage in order to turn on transistors QIR, QIBL, and QIBR, the read/write control signals DI and DI' are driven to the high voltage, and the $VYIN_1'$ is driven to the low voltage so that the voltage of the bit line is determined from the WE. Now, assuming that the transistor MNL in the cell $MC_{11}$ is turned on, the cell current Icell flows from the transistor QYL to VE through REL, MTL, and MNL. Thus, the current flowing to the transistor QYL is the sum of Icell and IBL, that is, Icell+IBL. Therefore, the base-emitter voltage VBE (QYL) of the QYL is $$VBE(QYL) = (nkT/q) \cdot \ln[(Icell+IBL)/Io],$$

where
k: Boltzmann's constant $= 1.38 \times 10^{-23}$ J/K
q: electronic charge $= 1.602 \times 10^{-19}$ C
n: emission coefficient (for instance, n=1.05)
T: absolute temperature, kelvins (e.g., T=323.15 K)
$I_0$: emitter-base saturation current.

On the other hand, the voltage V (REL) of the resistor REL is $$V(REL) = REL \cdot (Icell + IBL).$$

The current flowing to the transistor QYR is only IBR (=IBL). Thus, the base-emitter voltage VBE (QYR) of the QYR is $$VBE(QYR) = (nkT/q) \cdot \ln[IBL/Io].$$

The voltage V (RER) of the resistor RER (=REL) is $$V(RER) = REL \cdot IBL.$$

Therefore, the voltage difference ΔVB between the bit lines $BL_1$ and $BR_1$ is $$\begin{aligned}\Delta VB &= VBE(QYL) + V(REL) - VBE(QYR) - V(RER) \\ &= (nkT/q) \cdot \ln[(Icell + IBL)/IBL] + \\ &\quad REL \cdot Icell.\end{aligned} \quad (1)$$

Now, since $VYIN_1$ is set to the high voltage and the transistor QIR is turned on, the differential amplifier comprising the QRL and QRR is activated. Therefore, the differential amplifier detects the voltage difference ΔVB and outputs data to the common data lines CDL and CDR. On the other hand, for the non-selection bit line, the bit line select signal $VYIN_2$ is set to the low voltage and the QIR in $S_2$ is turned off, so that the differential amplifier in $S_2$ is not activated. The differential amplifier in $S_2$ does not output any data to the common data lines CDL and CDR. Therefore, since only the data of the cell $MC_{11}$ is outputted to the common data lines CDL and CDR, information of the cell $MC_{11}$ can be read out by detecting the data.

Next, when the memory cell $MC_{11}$ is selected and information is written, in a manner similar to the reading mode, the word line $W_1$ is first driven to the high voltage, the bit line select signal VYIN$_1$ is driven to the high voltage, and the bit line select signal VYIN$_1$' is driven to the low voltage. Then, in accordance with the write information, either one of the read/write control signals DI and DI' is driven to the low voltage. The signal WE is driven to the low voltage. When the transistor MNL in the cell MC$_{11}$ is now turned on, if DI' is driven to the low voltage, QIWR is turned on and the bit line BR$_1$ changes to the low voltage. Therefore, since the gate voltage of the MNL is set to the low voltage, the transistor MNL is switched from ON to OFF and the information in the cell is inverted.

In the embodiment, there are two points to be highlighted.

The first attractive point is that the selection bit line is switched and information is read out. That is, the information of the cell MC$_{11}$ is first read out, and when the information in the cell MC$_{12}$ is then read out by switching the selection bit line, VYIN$_1$ is driven to the low voltage, VYIN$_1$' is driven to the high voltage, VYIN$_2$ is driven to the high voltage, and VYIN$_2$' is driven to the low voltage. At this time, the transistor QIR in S$_1$ is switched from ON to OFF and the transistor QIR in S$_2$ is switched from OFF to ON. Therefore, the differential amplifier in S$_1$ is not activated and the differential amplifier in S$_2$ is activated and the data of the cell MC$_{12}$ is outputted to the common data lines CDL and CDR. It should be noted that, in general, since the switching time of the bipolar transistor is fast as about 0.5 nsec, only an extremely short time is required until the differential amplifier is switched to the activated state, so that the access time to switch the selection bit line and to read out information is remarkably fast.

The second attractive point relates to the case of writing information. That is, when the memory cell MC$_{11}$ is selected and information is written, as already mentioned above, in accordance with the write information, it is necessary to discharge either one of the bit lines BL$_1$ and BR$_1$ and to drive that one bit line to the low voltage. Therefore, upon writing, the read/write control signal DI or DI' is driven to the low voltage and the QIWL or QIWR is switched from OFF to ON. It should be noted here that since the switching time of the bipolar transistor is fast as about 0.5 nsec, only an extremely short time is required to discharge the bit line and to drive the bit line to the low voltage, so that the writing time is fairly fast.

Further, in the embodiment, the current which is supplied to the differential amplifier or bit line is generated from a constant current source (IR or IWL, IWR). When the current to drive the differential amplifier is made constant as mentioned above, the discharge times of the common data lines CDL and CDR can be made constant and there are advantages such that not only a variation in access time can be reduced but also, if the data current flowing through the common data lines CDL and CDR is constant, the data can be stably detected. On the other hand, when the current which is supplied to the bit line is made constant, there are advantages such that the discharge time of the bit line can be made constant and a variation in writing time can be reduced.

On the other hand, as shown in the equation (1), IBL (=IBR) or REL (=RER) is a design parameter to decide the voltage difference ΔVB between the bit lines BL$_1$ and BR$_1$ and can be set to any value in accordance with the design. For instance, it is possible to set such that IBL=IBR=0 or REL=RER=0. The same shall also similarly apply to the following embodiments.

Embodiment 2

Figure 3B:
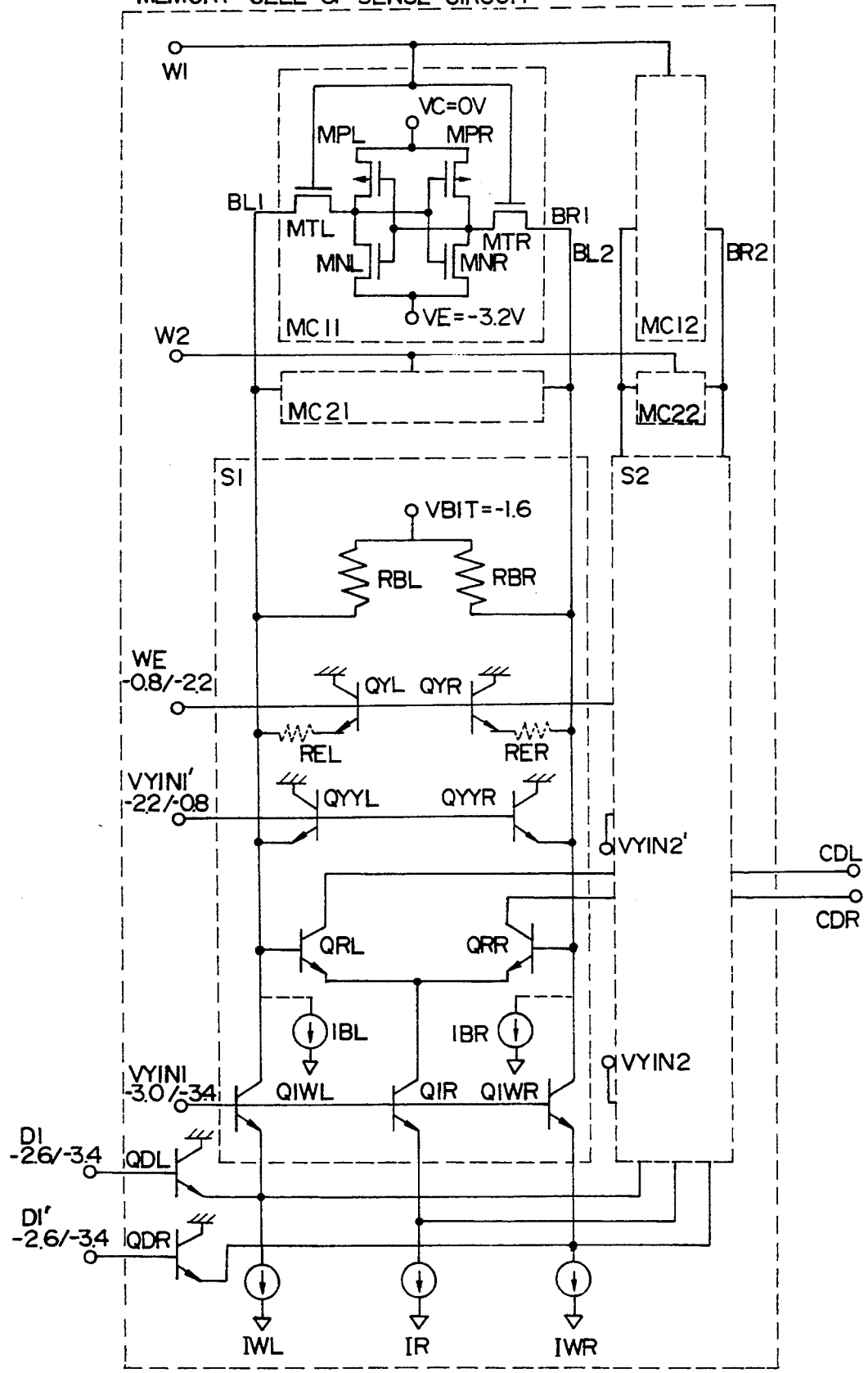

FIG. 3B is a diagram showing the second embodiment of the invention. FIG. 3B differs from FIG. 3A with respect to only a point that in FIG. 3B, the QIBL and QIBR in FIG. 3A are eliminated and constant current sources IBL and IBR are directly connected to the bit line. Therefore, in the second embodiment as well, the discussion performed in FIG. 3A is satisfied as it is and the access time to read out information by switching the selection bit line and the writing time are extremely fast. The reason why the constant current sources IBL and IBR are directly connected to the bit line in FIG. 3B is because with such a structure, the number of transistors which are driven by the VYIN$_1$ and VYIN$_2$ is reduced, so that the access time when information is read out by selecting the selection bit line can be made even faster.

Embodiment 3

Figure 4A:
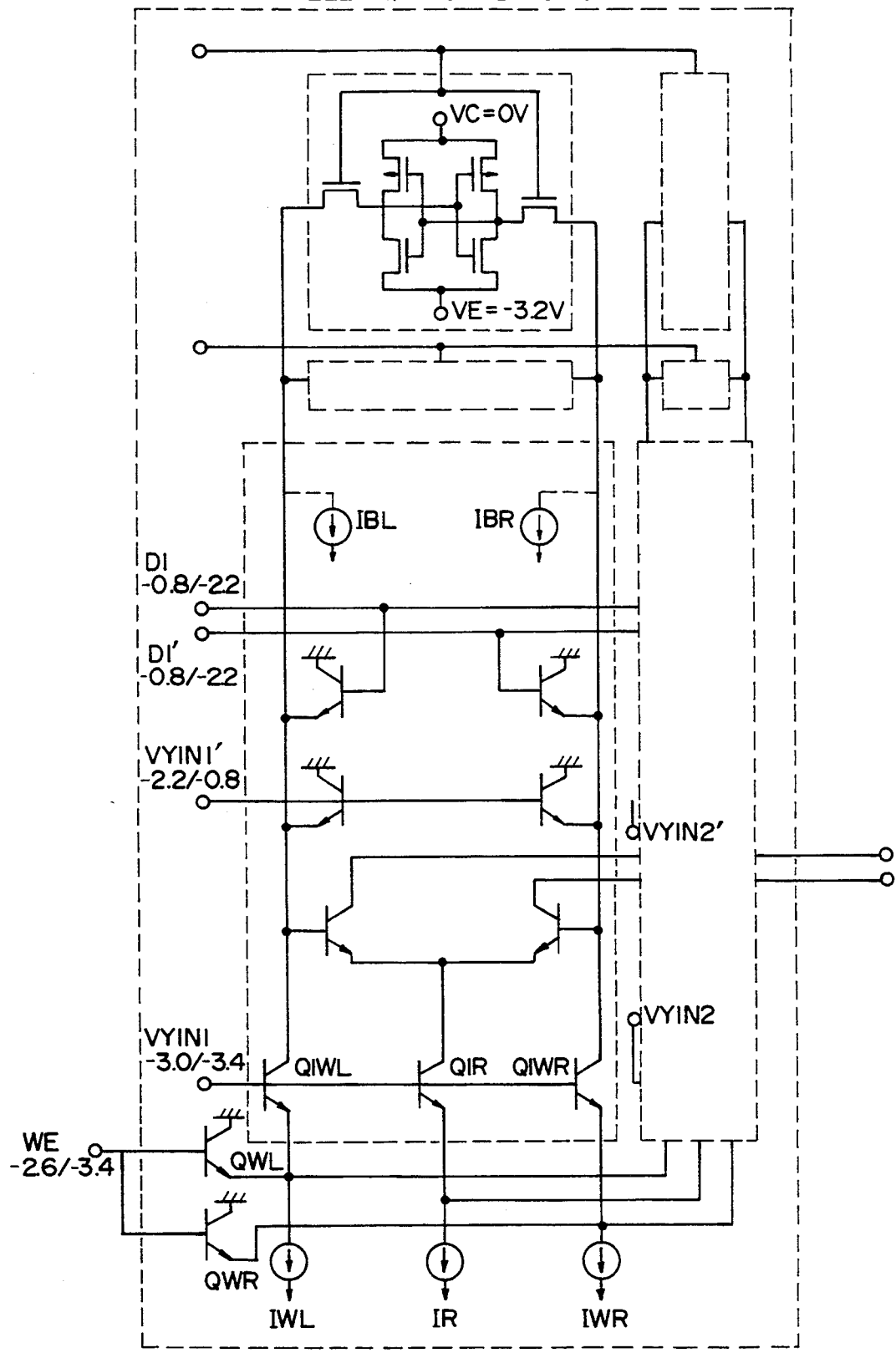
FIGS. 4A and 4B are circuit diagrams showing the third embodiment of the invention.
Figure 4B:
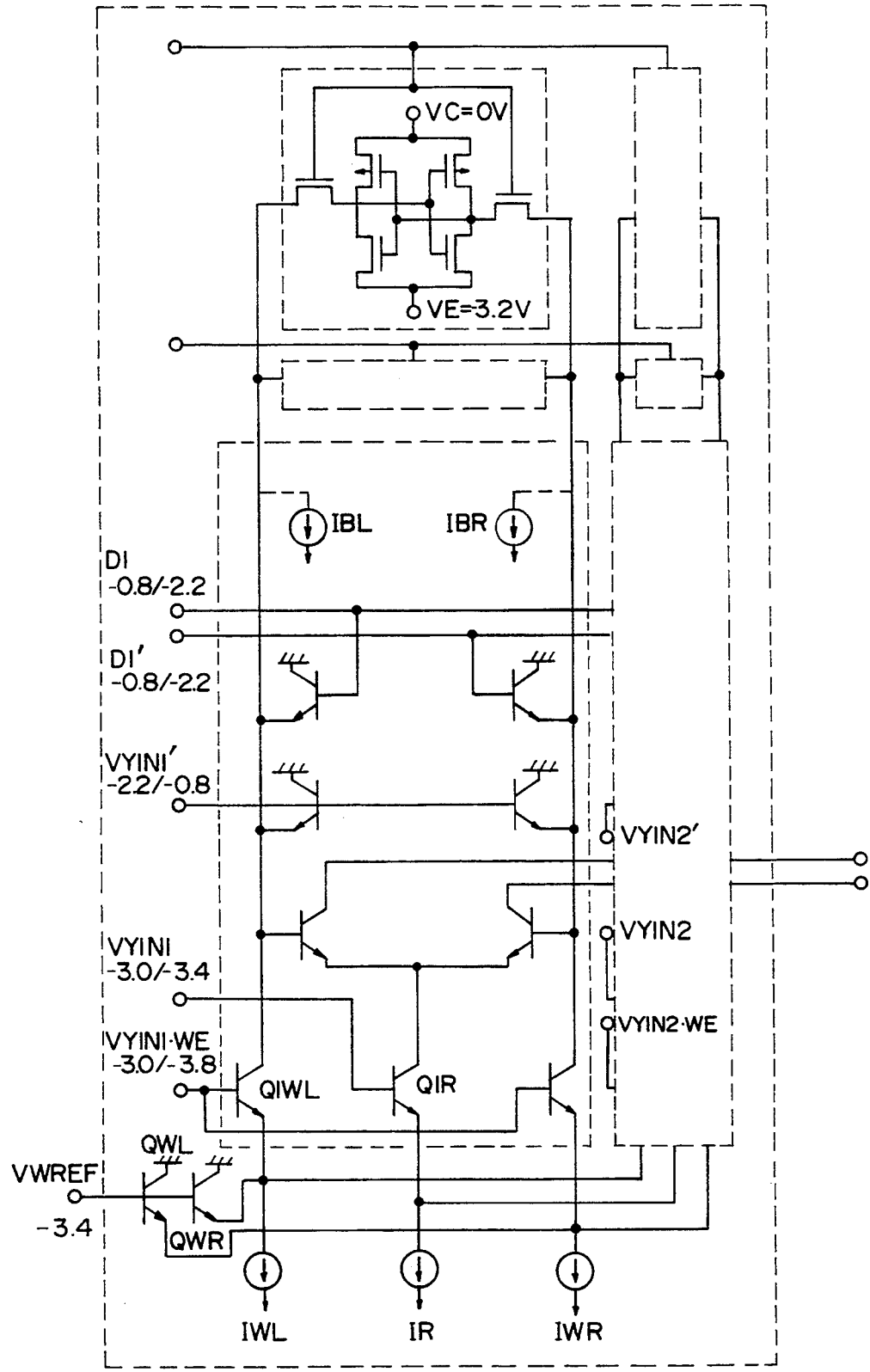

FIGS. 4A and 4B are diagrams showing the third embodiment of the invention. FIG. 4A differs from FIG. 3B with respect to only a point that the input positions of the read/write control signals WE and DI and DI' are exchanged. FIG. 4B differs from FIG. 4A with respect to only a point that in FIG. 4A, the signal WE is inputted to the bases of the QWL and QWR, while in FIG. 4B, a constant voltage VWREF is applied to the bases of the QWL and QWR, and in place of it, a signal indicative of the result of the logic calculation of the bit line select signal VYIN and read/write control signal WE is inputted to the bases of the QIWL and QIWR. Therefore, in this embodiment as well, the discussion which was made in FIG. 3A is satisfied as it is and the access time to read out information by switching the selection bit line and the writing time are extremely fast.

Even in FIG. 3 and FIGS. 1 and 5 to 9, which will be explained hereinlater, it will be obviously understood that a change similar to the change from FIGS. 4A to 4B can be executed.

Embodiment 4

Figure 5:
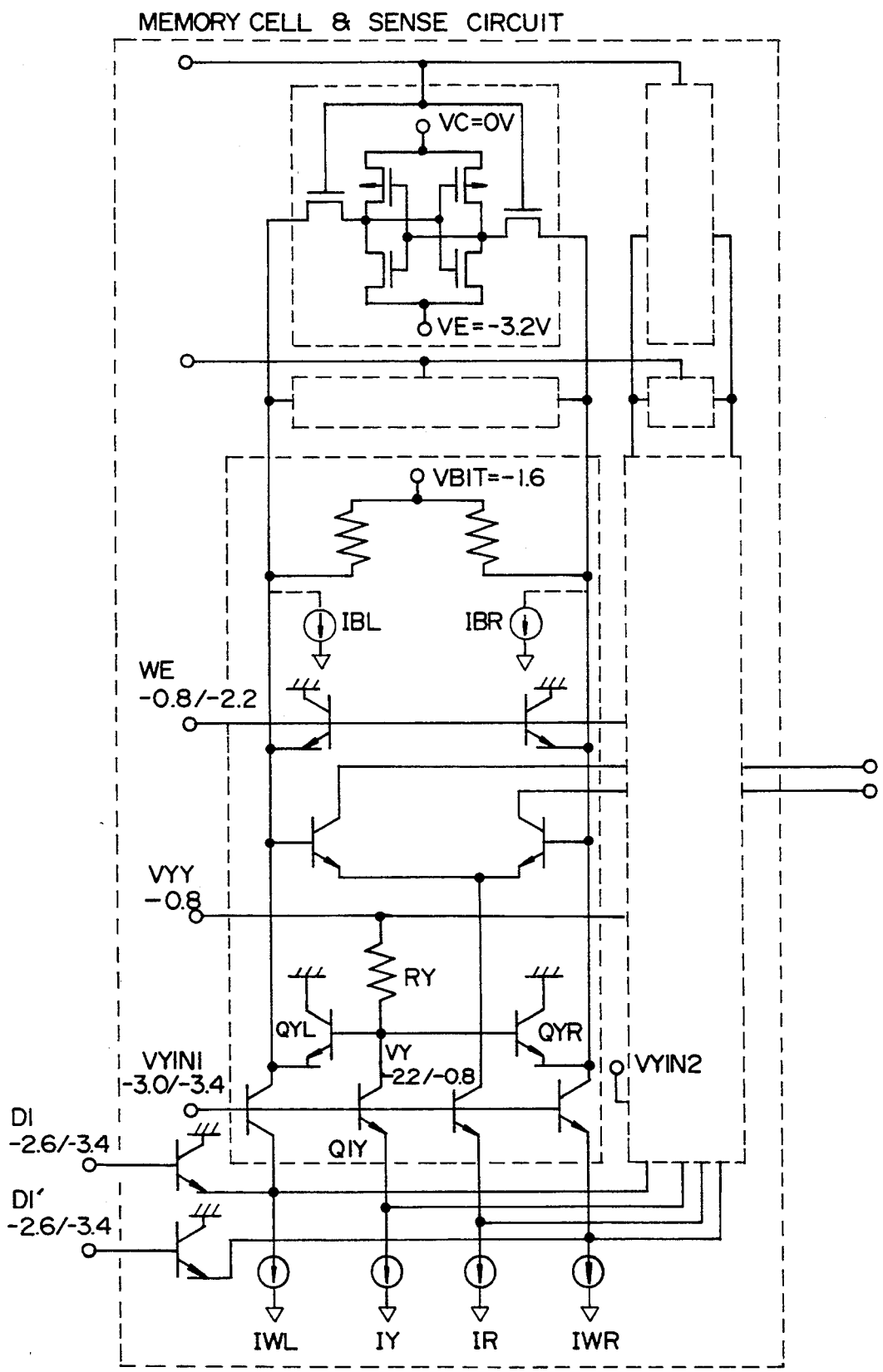
FIG. 5 is a circuit diagram showing the fourth embodiment of the invention.

FIG. 5 is a diagram showing the fourth embodiment of the invention. FIG. 5 differs from FIG. 3B with respect to only a point that in FIG. 5, the signal VYIN$_1$' (VY in FIG. 5) which is inputted to the QYYL and QYYR (in FIG. 5, QYL and QYR) in FIG. 3B is generated from the signal VYIN$_1$ by a constant voltage source VYY, a resistor RY, a transistor QIY, and a constant current source IY. Therefore, even in the fourth embodiment as well, the discussion performed in FIG. 3A is satisfied as it is and the access time to read out information by switching the selection bit line and the writing time are extremely fast. The reason why the signal VY is generated from the signal VYIN$_1$ in FIG. 5 is because with such a construction, there is no need to input the signal VYIN$_1$' from the outside.

Embodiment 5

Figure 6:
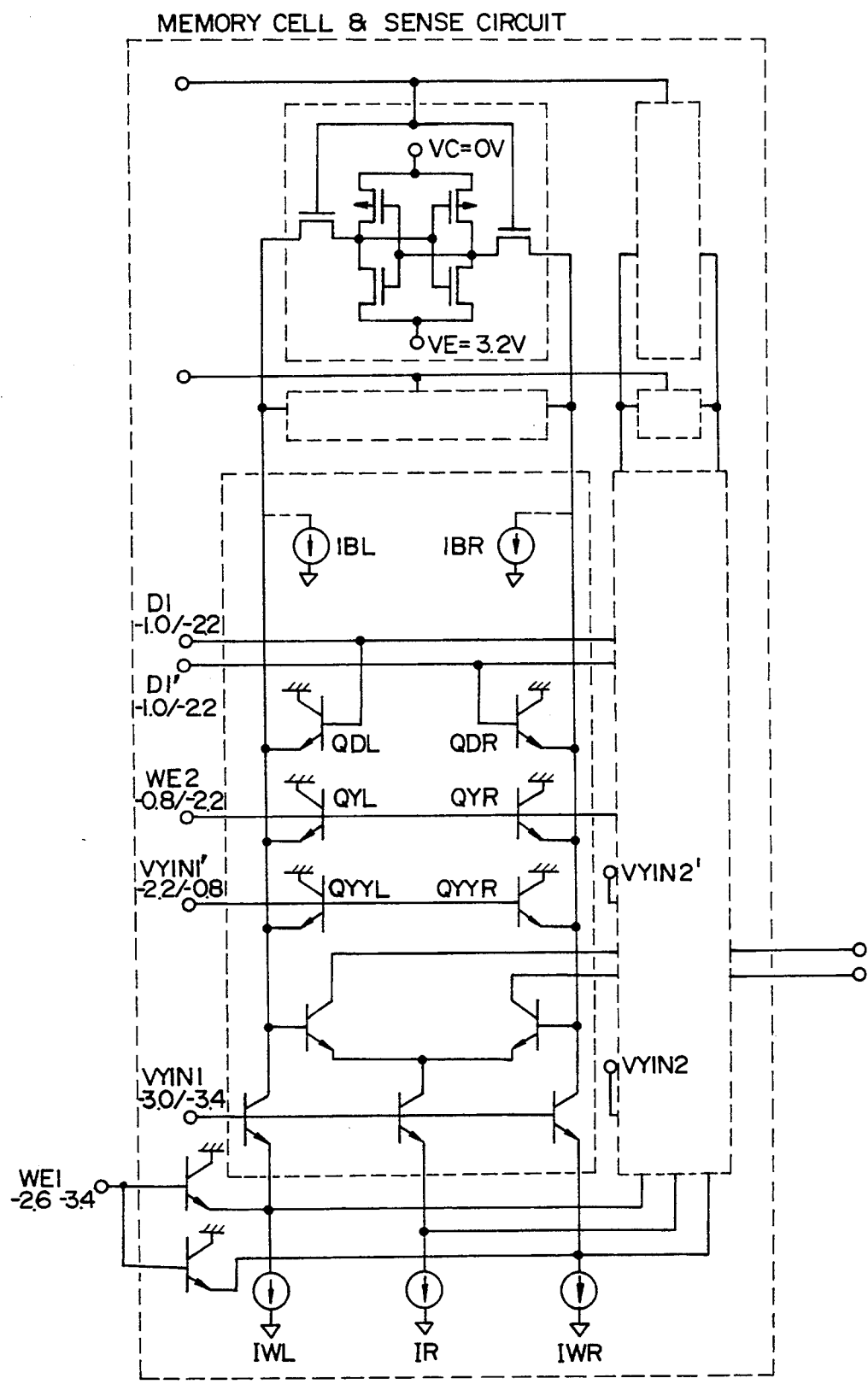
FIG. 6 is a circuit diagram showing the fifth embodiment of the invention.

FIG. 6 is a diagram showing the fifth embodiment of the invention. FIG. 6 differs from FIG. 4A with respect to only a point that in FIG. 6, transistors QYL and QYR which do not exist in FIG. 4A are added. Therefore, even in the fifth embodiment as well, the discussion performed in FIG. 3A is satisfied as it is and the access time to read out information by switching the selection bit line and the writing time are extremely fast. The reason why the transistors QYL and QYR are added in FIG. 6 is because with such a construction, the voltage of the bit line when information is read out is decided by WE2 and, for instance, even if the levels of the DI and DI' are not equal or different, no influence is exerted on the voltage of the bit line, so that an error of the differential amplifier operation can be prevented.

Embodiment 6

Figure 1A:
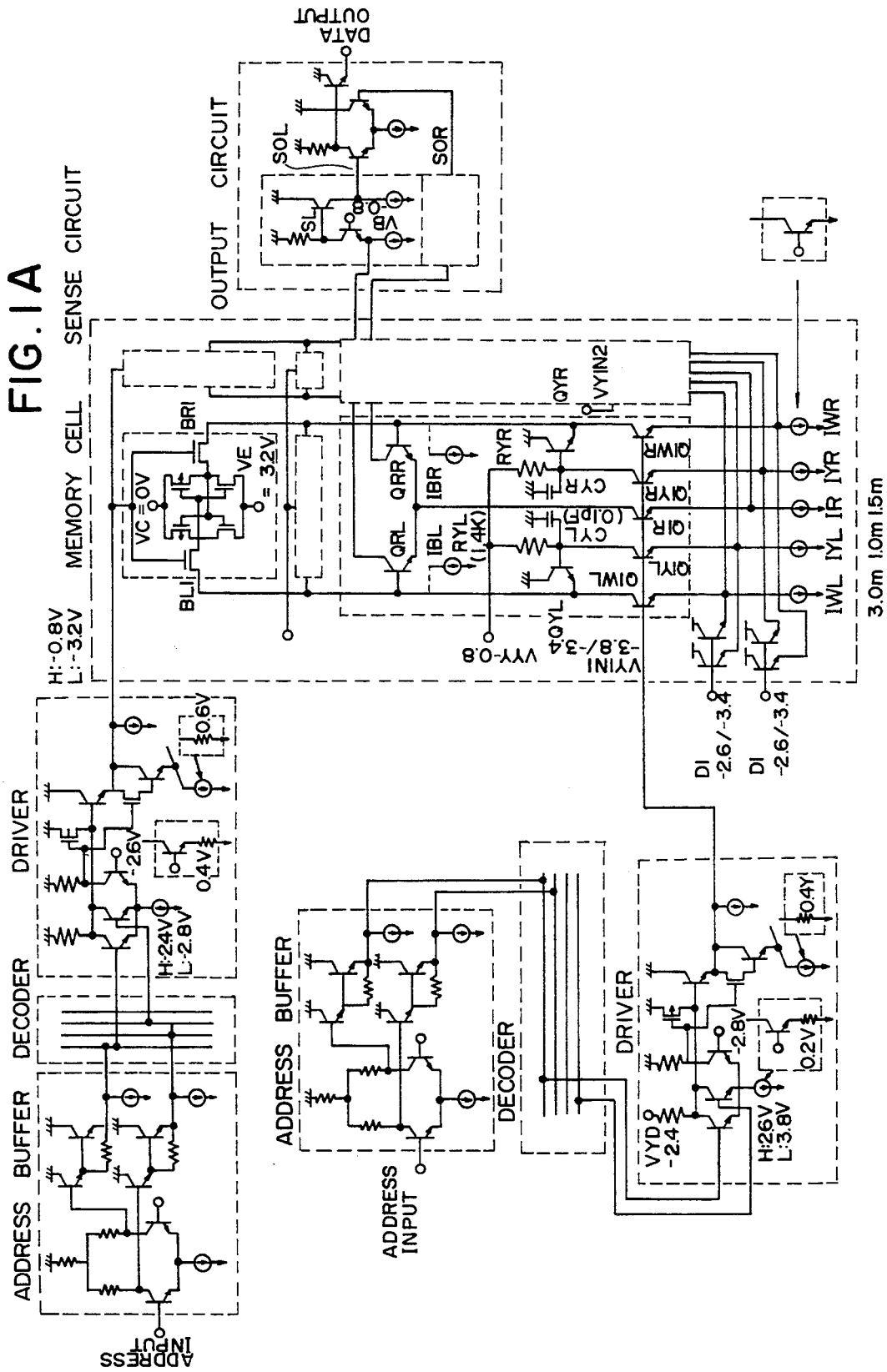
FIGS. 1A to 1C are circuit diagrams showing the sixth embodiment of the present invention.
Figure 1B:
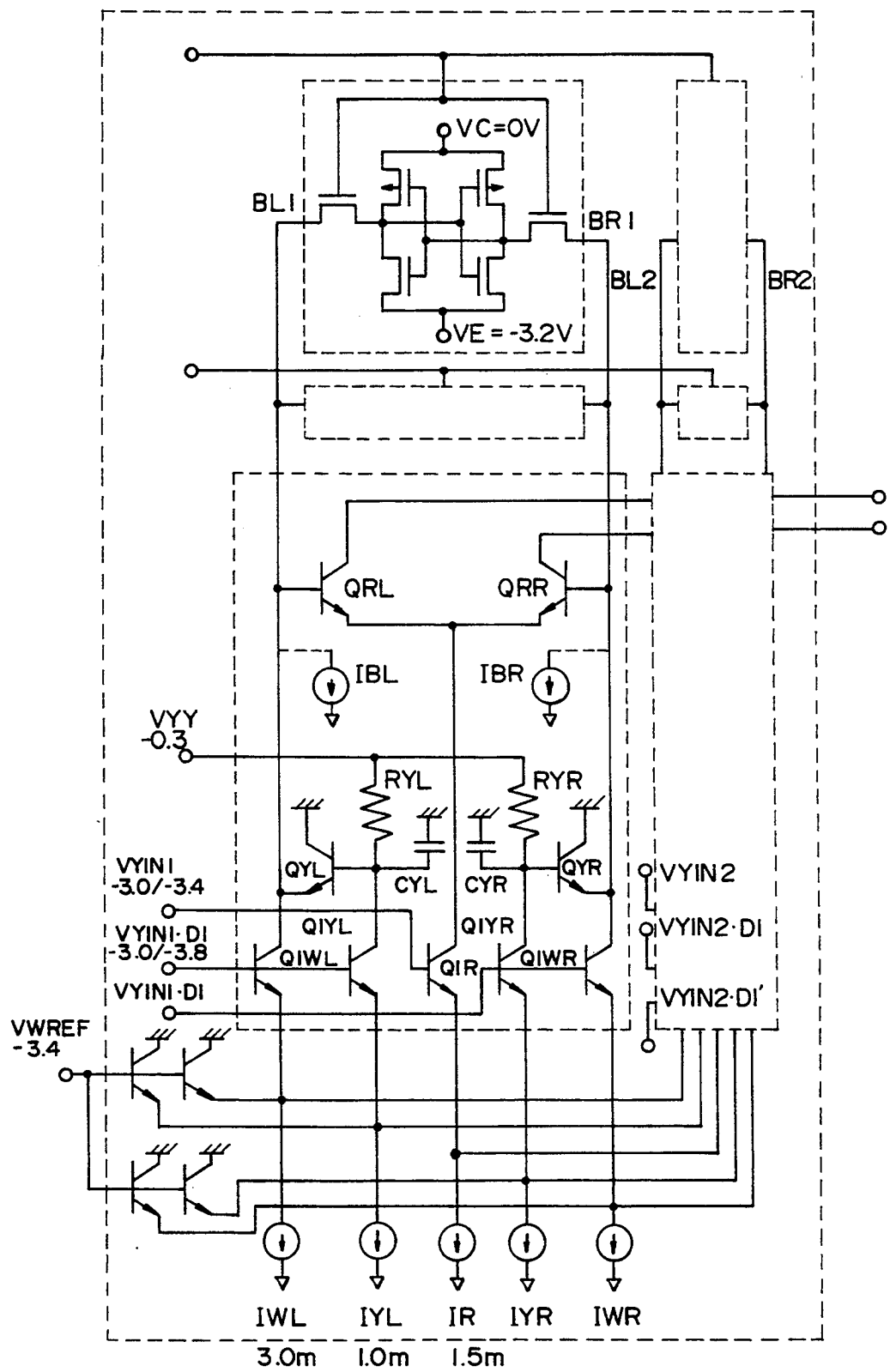
Figure 1C:
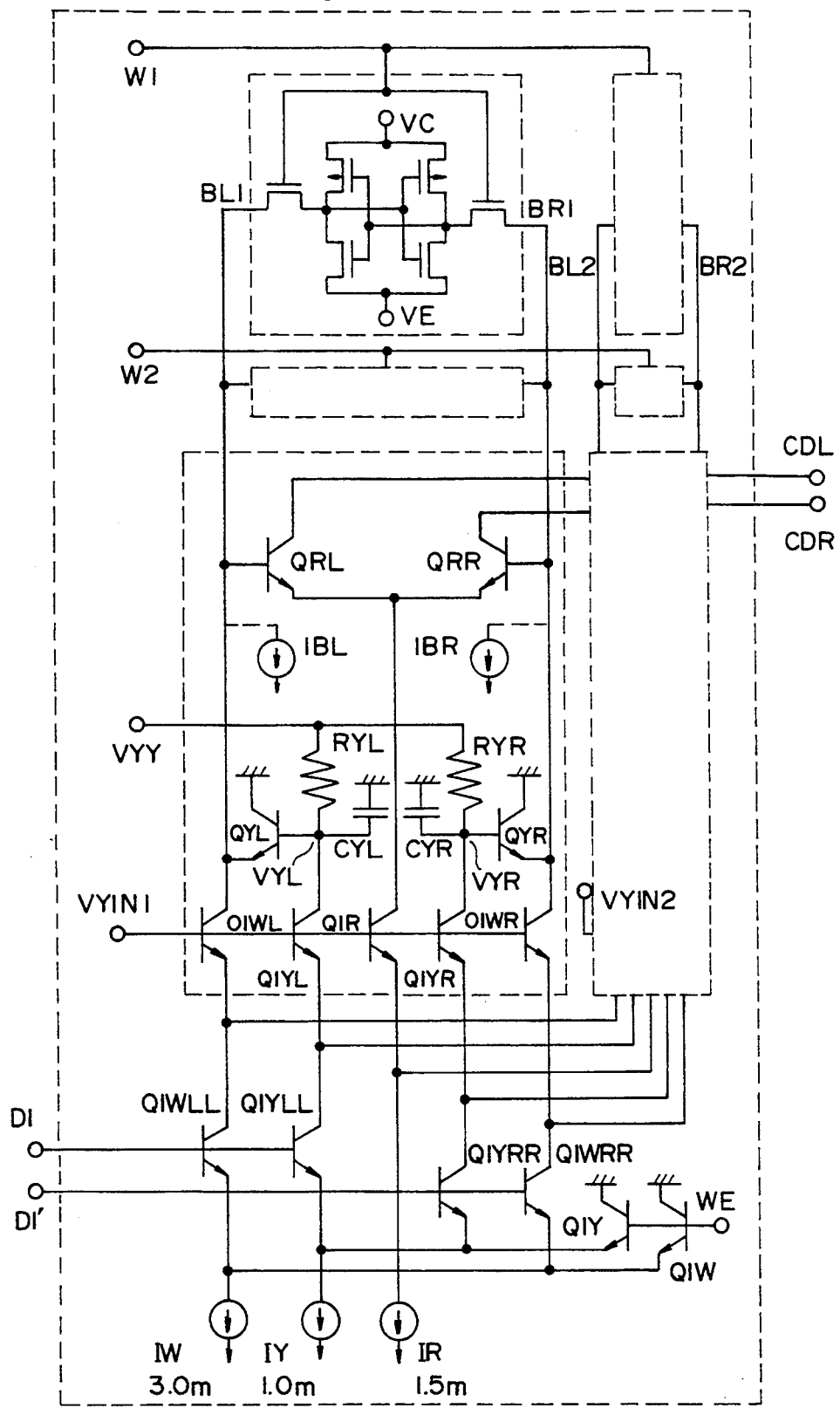
Figure 2:
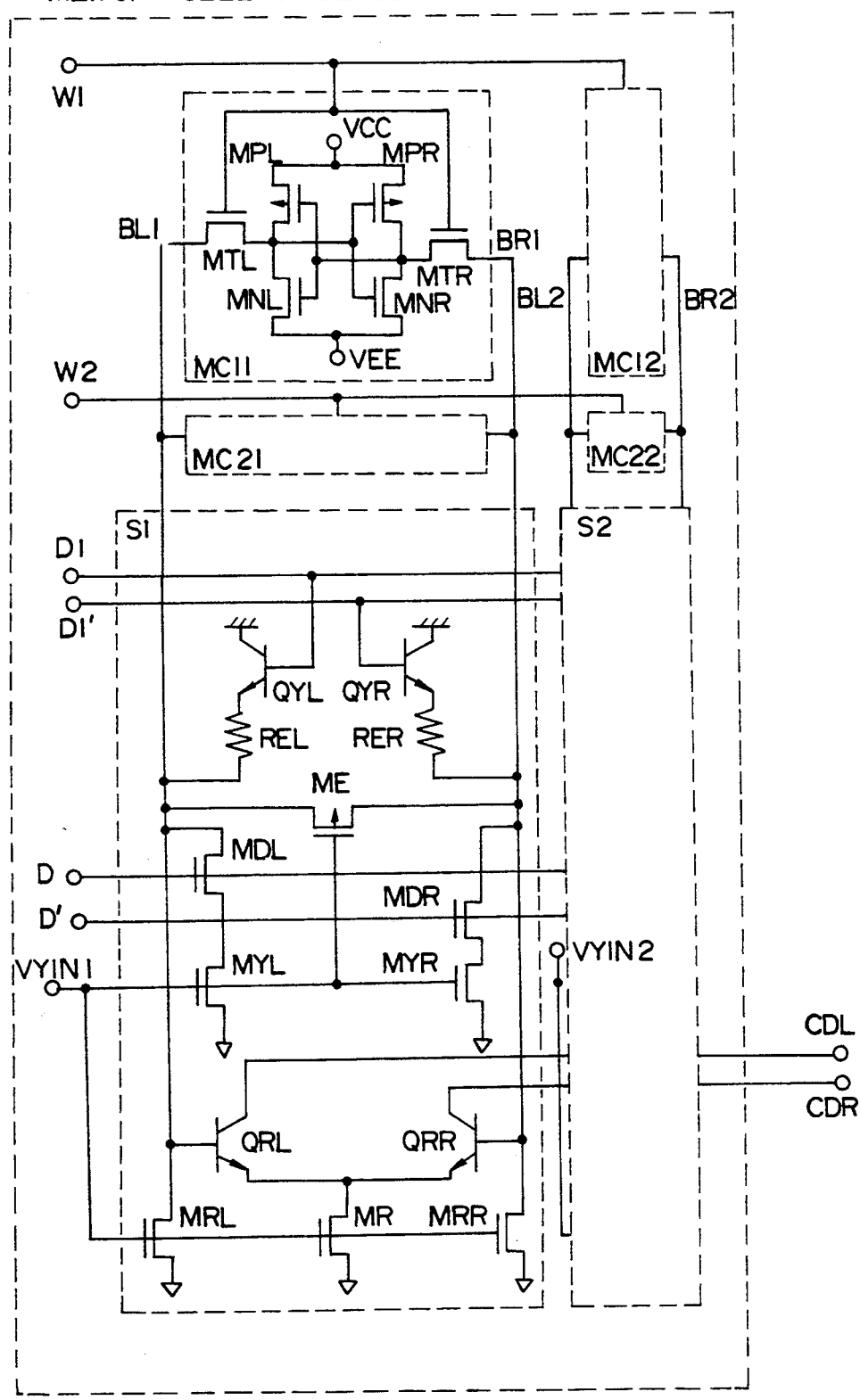
FIG. 2 is a circuit diagram for explaining the problems in a conventional example.

FIGS. 1A to 1C are diagrams showing the sixth embodiment of the invention. FIG. 1A differs from FIG. 3B with respect to only a point that in FIG. 1A, the signal corresponding to the signal WE which is inputted to the transistors QYL and QYR in FIG. 3B is generated from the signal VYIN$_1$ and signals DI and DI' by the constant voltage source VYY, resistors RYL and RYR, transistors QIYL and QIYR, and constant current sources IYL and IYR. Therefore, in the sixth embodiment as well, the discussion performed in FIG. 3A is satisfied as it is and the access time to read out information by switching the selection bit line and the writing time are extremely fast. The reason why in FIG. 1A, the signal which is inputted to the transistors QYL and QYR is generated from the signals VYIN$_1$, DI, and DI' is because with such a construction, there is no need to input the signal WE from outside the device.

Capacitors CYL and CYR connected to the bases of the QYL and QYR are provided to reduce the overshoot of the bit line which occurs when the QYL or QYR charges the bit line after completion of the writing and to attain a high speed of a write recovery time.

On the other hand, since an address buffer, a decoder, and an output circuit shown in the embodiment are well-known circuits, the description of the operations of those circuits is omitted here. On the other hand, a driver shown in the embodiment is substantially the same circuit as a circuit in FIG. 12, which will be explained hereinlater. The operation of the driver will be explained in conjunction with FIG. 12. The above circuits are shown as a mere example and the invention is not limited to them.

A method of constructing the practical circuits of the voltage value, current value, and current source shown in the embodiment relates to merely one example and the invention is not limited to them.

FIG. 1B is a diagram showing an example in the case where in FIG. 1A, a change similar to the change from FIG. 4A to FIG. 4B is executed.

FIG. 1C differs from FIG. 1A with respect to only a point that in FIG. 1A, the constant current sources IWL, IWR, IYL, and IYR are switched in the voltage relation among the signal VYIN and the signals DI and DI', in FIG. 1C, the constant current sources IW and IY are switched by the voltage relation among the signals DI and DI' and the signal WE. With the construction of FIG. 1C, the size of constant current sources WL, IWR, IYL, and IYR in FIG. 1A can be reduced by half, respectively, so that a low electric power consumption can be accomplished. A constant voltage can be also used as a signal WE in FIG. 1C or a differential signal for the signals DI and DI' can be also used.

Even in FIGS. 3 to 6 and FIGS. 7 to 9, which will be explained hereinlater, a change similar to the change from FIG. 1A to FIG. 1C can be also obviously executed.

Embodiment 7

Figure 7:
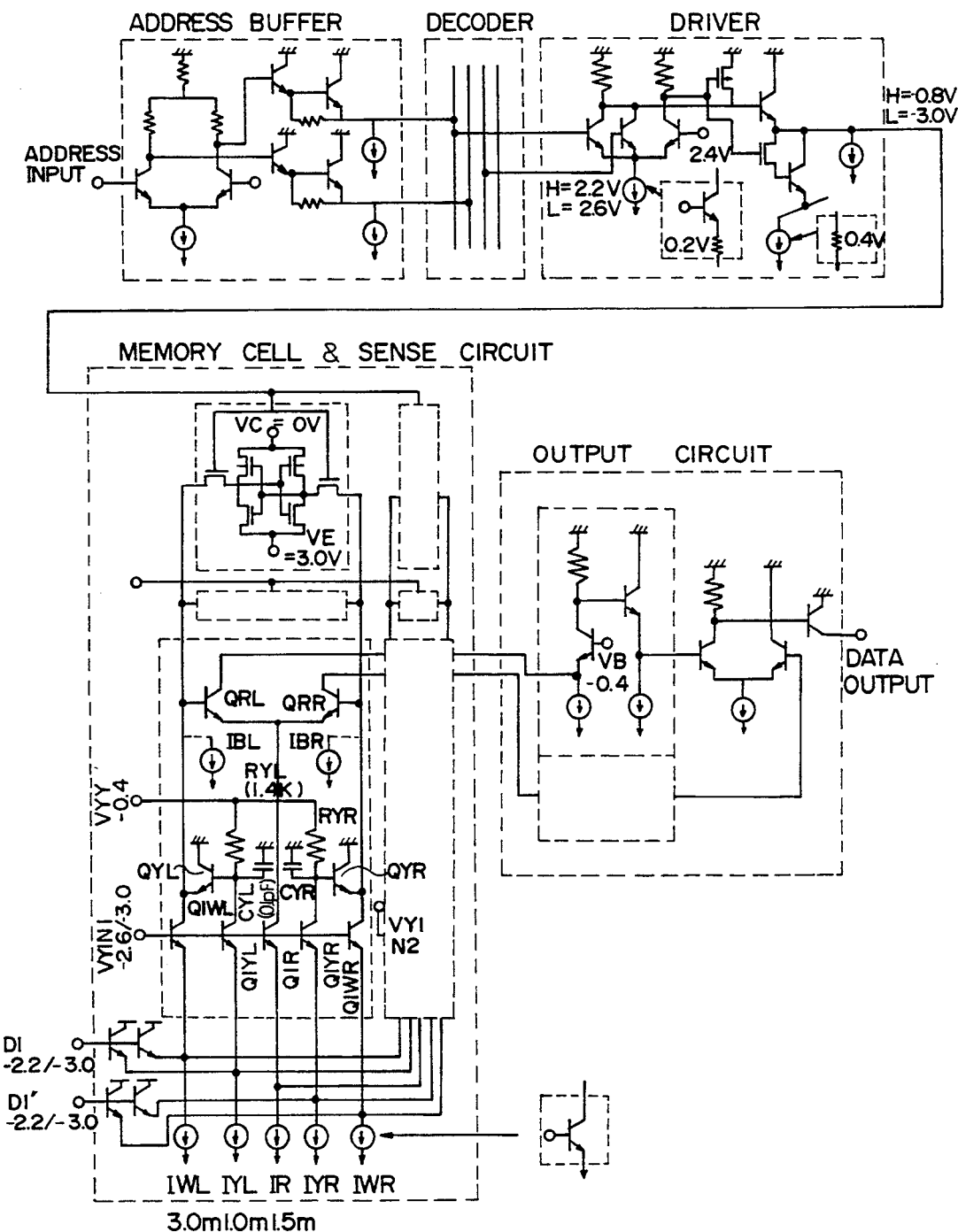
FIG. 7 is a circuit diagram showing the seventh embodiment of the invention.

FIG. 7 is a diagram showing the seventh embodiment of the invention. FIG. 7 differs from FIG. 1A with respect to only a point that in FIG. 1A, the power source voltage VEE is set to −5.2 V, while in FIG. 7, VEE=−4.5 V. Therefore, even in the seventh embodiment as well, the discussion performed in FIG. 3A is satisfied as it is and the access time to read out information by switching the selection bit line and the writing time are extremely fast.

Embodiment 8

Figure 8:
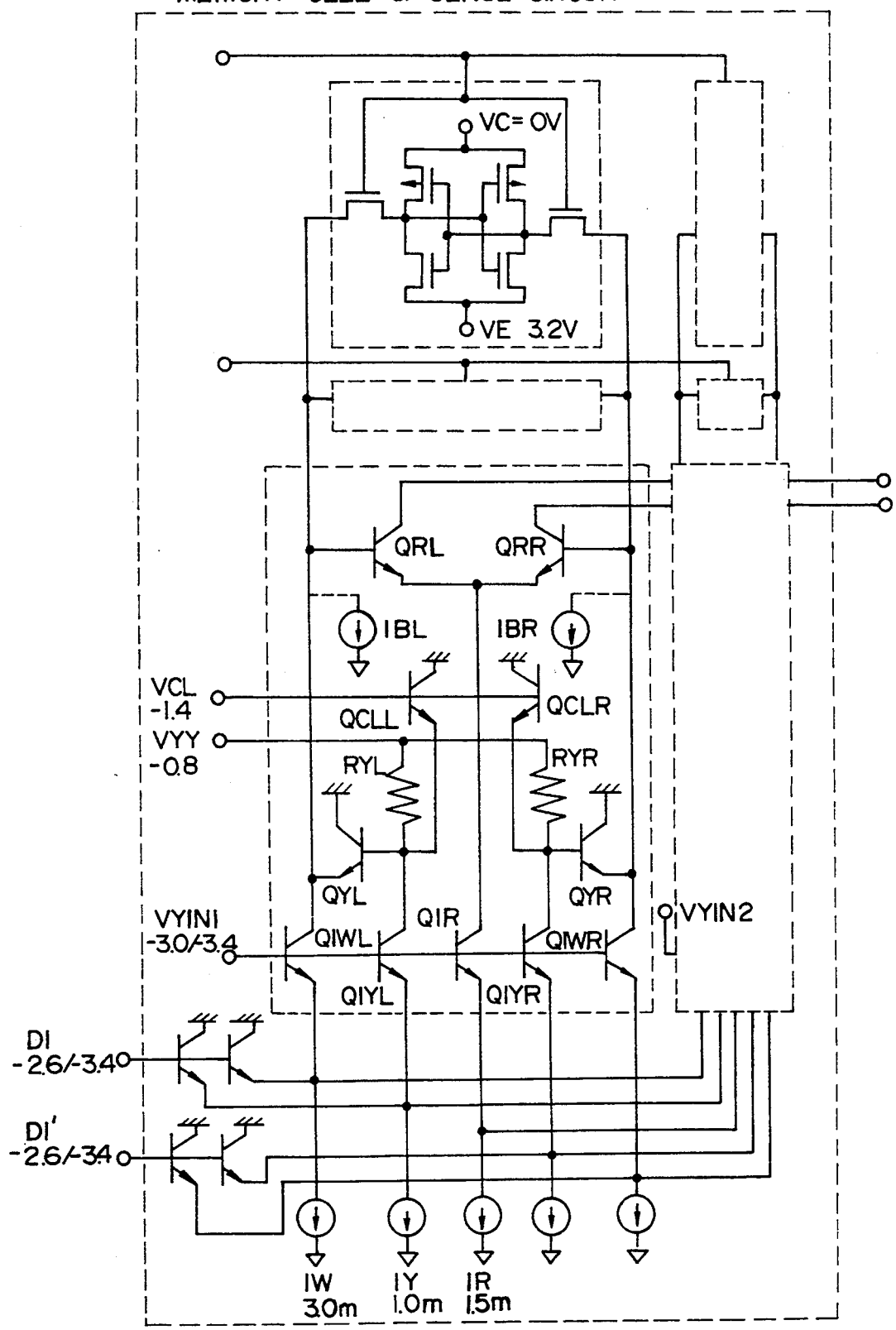
FIG. 8 is a circuit diagram showing the eighth embodiment of the invention.

FIG. 8 is a diagram showing the eighth embodiment of the invention. FIG. 8 differs from FIG. 1A with respect to only a point that in FIG. 8, the capacitors CYL and CYR in FIG. 1A are eliminated, and in place of them, a constant voltage source VCL and transistors QCLL and QCLR are provided. Therefore, even in the eighth embodiment as well, the discussion performed in FIG. 3A is satisfied as it is and the access time to read out information by switching the selection bit line and the writing time are extremely fast. The reason why in this embodiment, the CYL and CYR are eliminated and in place of them, the VCL, QCLL, and QCLR are provided is because the voltage of the bit line when information is read out is determined from QCLL and QCLR and in place of them, even if the resistance values of the resistors RYL and. RYR are set to large values, the overshoot of the bit line which occurs upon completion of the writing can be reduced and the write recovery time can be made fast.

Embodiment 9

Figure 9:
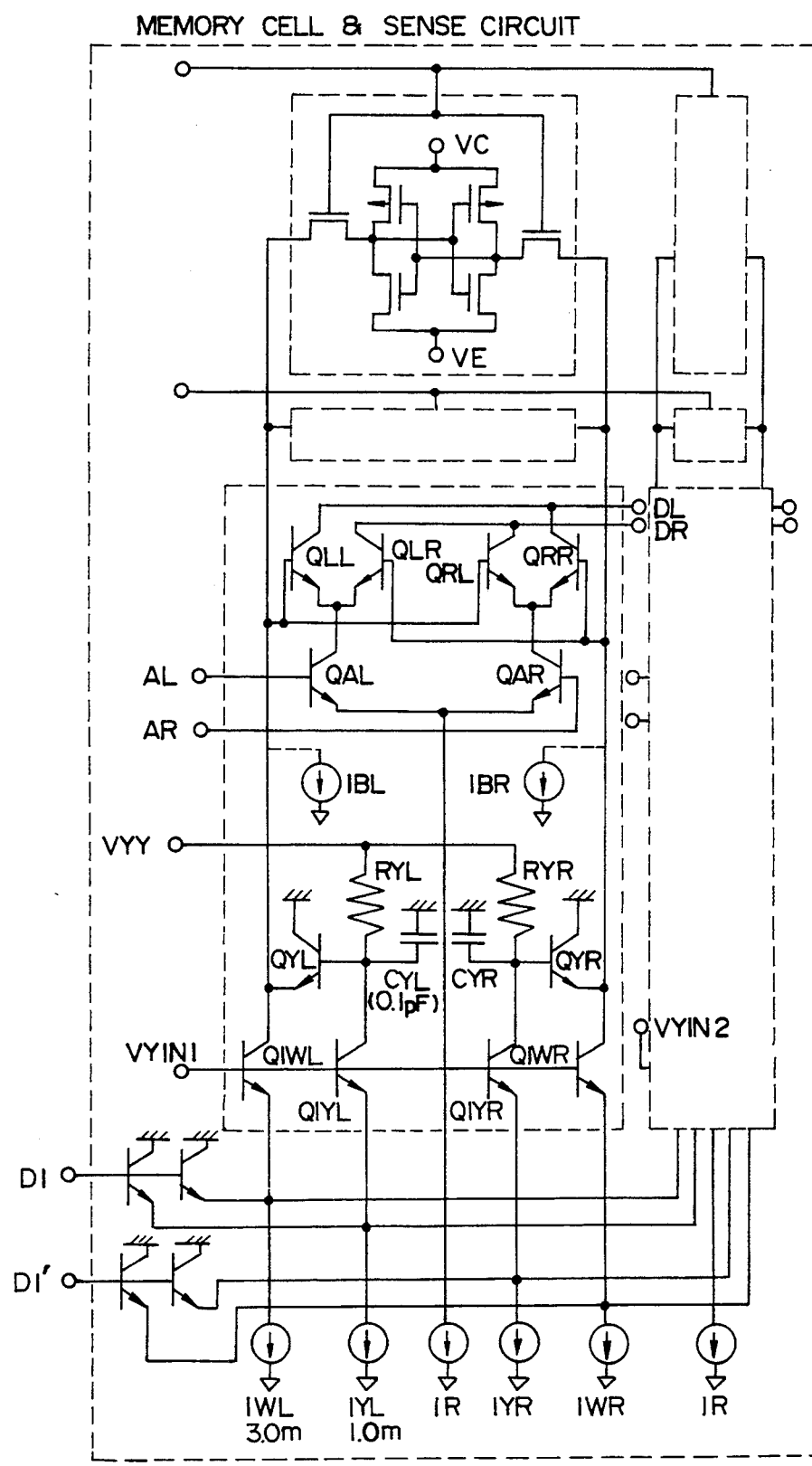
FIG. 9 is a circuit diagram showing the ninth embodiment of the invention.

FIG. 9 is a diagram showing the ninth embodiment of the invention. FIG. 9 differs from FIG. 1A with respect to only a point that in FIG. 1A, the data of the memory cell is outputted as it is, while in FIG. 9, the data of the memory cell and the data from the outside are compared every bit line and the result of the comparison is outputted. Therefore, even in the ninth embodiment as well, the discussion performed in FIG. 3A is satisfied as it is and the writing time is extremely fast. In the ninth embodiment, the exclusive OR of the data of the memory cell and the data (AL, AR) from the outside are calculated and the results are outputted to the data lines DL and DR.

Embodiment 10

FIG. 10 is a diagram showing the tenth embodiment of the invention and shows an example of a layout diagram of the memory cells shown in FIGS. 1 and 3 to 9. The layout diagram has a feature such that a constant voltage line VE is connected in parallel to bit lines BL and BR. With the above structure, there are the following two advantages.

Generally, when information is written into the cell, the bit line is charged or discharged in order to set the bit line to the high or low voltage. As already mentioned above, how fast the charging/discharging operation is executed is a point to attain a high speed of the writing time. However, when the bit line is charged/discharged at an extremely high speed, a signal is propagated to the bit line of the adjacent cell through a coupling capacitance. Such a signal results in noises for the bit line of the adjacent cell. However, as shown in FIG. 10, when the constant voltage line VE is connected in parallel with the bit lines BL and BR at the boundary between the adjacent cells, the bit lines of the adjacent cells are mutually shielded by the constant voltage line VE. Thus, the coupling noises are not generated. Such a point is the first advantage.

It will be obviously appreciated that when the constant voltage line VE (or VC) is connected between the bit lines BL and BR which are connected to the same cell, the coupling noises between the BL and the BR can be also prevented.

In FIGS. 1 and 3 to 9, the currents Icell flowing to the cells connected to the selection word line all flow into the constant voltage line VE. Therefore, when the constant voltage line VE is connected in parallel with the word line, the Icell of all of the cells connected to the selection word line concentratedly flow to one constant voltage line VE. Thus, in this case, in order to assure the voltage drop and electromigration due to a wiring resistance, it is necessary to set a wiring width of the constant voltage line VE to large enough value, causing an increase in area of the memory cell. On the other hand, as shown in FIG. 10, when the constant voltage line VE is arranged in parallel with the bit line, the currents Icell of the cells connected to the selection word line are distributed and flow to the constant voltage line VE arranged in parallel with the bit line corresponding to each cell. Therefore, the wiring width of the constant voltage line VE can be reduced and the memory cell area can be decreased. Such a point is the second advantage.

In FIGS. 1 and 3 to 9, in the case where the voltage design is executed so that the currents Icell of the cells connected to the selection word line flow from the VC or in the case where the N channel MIS FET and the P channel MIS FET are exchanged and the NPN bipolar transistor is replaced by the PNP bipolar transistor and all of the voltage relations are reversed, it will be obviously understood that the similar effects are obtained by wiring the constant voltage line VE in parallel with the bit line.

Embodiment 11

Figure 11A:
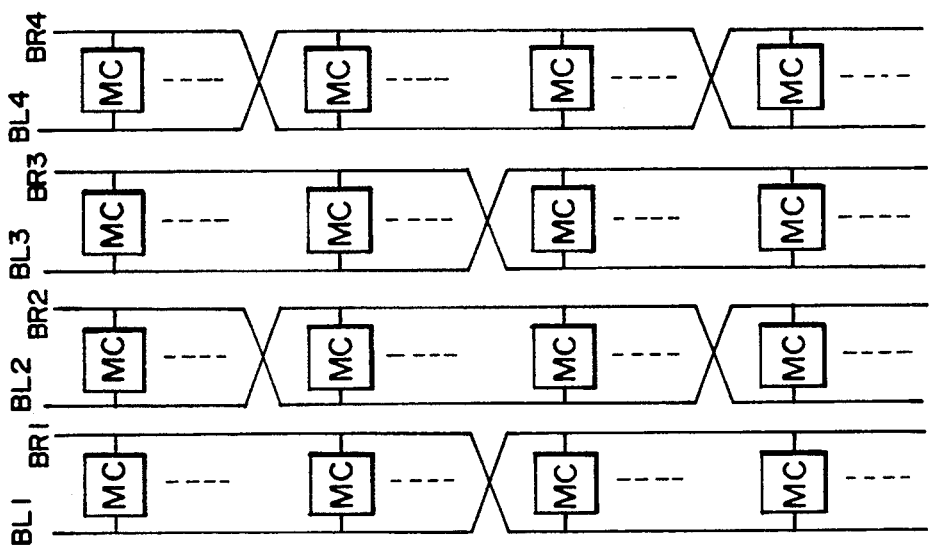
FIGS. 11A and 11B are diagrams showing layouts of bit lines showing the eleventh embodiment of the invention.
Figure 11B:
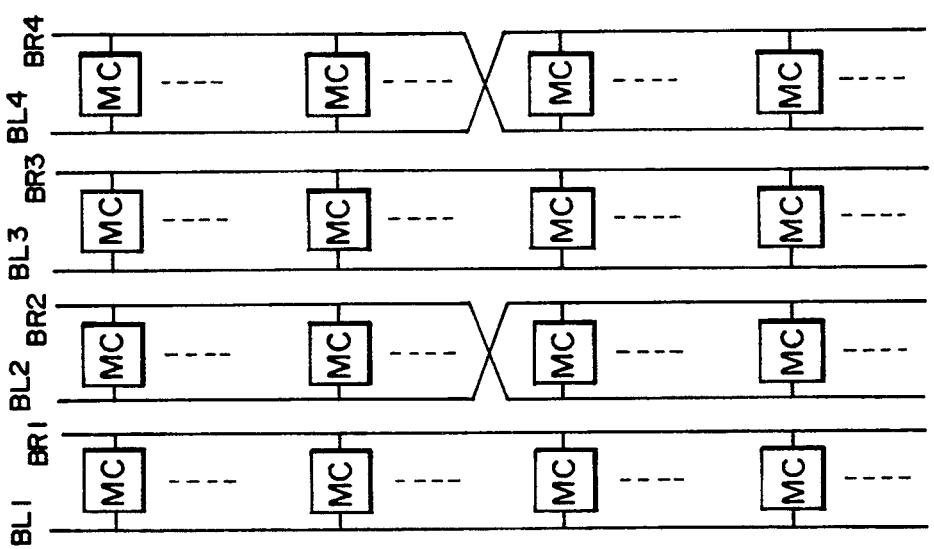

FIG. 11 is a diagram showing the eleventh embodiment of the invention and shows an example of a wiring layout diagram of the bit lines shown in FIGS. 1 and 3 to 9. It is a feature of the layout diagram that the positional relation between the adjacent bit lines is replaced in the way of the cell array. With such a structure, as already mentioned above, the coupling noises can be reduced without needing to shield by the constant voltage line. That is, in FIG. 11A, since the positional relation of the bit lines is replaced at the intermediate point of the cell array every other pair, the magnitude of the coupling noises can be reduced about ½. On the other hand, in FIG. 11B, since the positional relation of the bit lines is replaced at the intermediate point and ¼ point of the cell array every other pair, the magnitude of the coupling noises can be reduced about ¼.

In the above embodiment, explanation has been made with respect to mainly an example in which the memory cell is constructed by cross-coupling the P channel MIS FET and the N channel MIS FET. However, the invention is not limited to such a memory cell. That is, for instance, the invention can be also applied to a memory cell in which the MIS FET is replaced by a junction FET, a memory cell comprising a resistive load and an N channel FET, or a memory cell comprising a resistive load and a P channel FET.

Embodiment 12

In association with the realization of a high density of the semiconductor memory as described above, the number of cells which are connected to the word lines and bit lines increases and the stray capacitances of the word lines and bit lines increase. Therefore, the access time of the memory depends on the charge/discharge times of the word lines and bit lines. Accordingly, for instance, in a bipolar RAM (random access memory), a number of high speed word line discharge circuits as disclosed in JP-A-59-132490 have been proposed. However, the conventional discharge circuit has a problem such that when the signal of the word line is set to the high voltage, a current is always supplied to the word line, so that the voltage of the word line drops.

Figure 13:
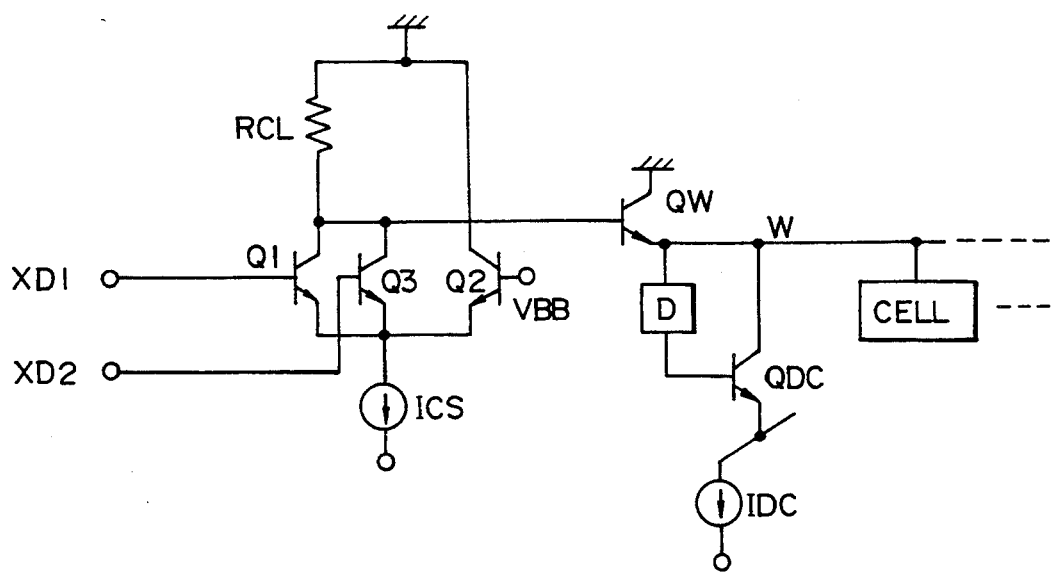
FIG. 13 is a circuit diagram of a word line discharge circuit of a memory and a word line driver showing a conventional example.

FIG. 13 shows an example of the conventional discharge circuits. In the diagram, the discharge circuit is shown by a bipolar transistor QDC, a delay circuit D, and a current source IDC. The operation principle of the discharge circuit will now be simply described hereinbelow. When the word line W is now selected and is set to the high voltage, the discharge current IDC flows to the word line W. Then, when the word line is switched from the high voltage to the low voltage, since the delay circuit D exists, the transistor QDC is not soon turned off but the discharge current IDC continuously flows until the word line is set to the sufficiently low voltage. Thus, the word line can be switched from the high voltage to the low voltage at a high speed. However, in the conventional discharge circuit, since a current is always supplied to the word line when the word line is at the high voltage, there is a problem such that the voltage of the selected word line drops due to an increase in base-emitter voltage of the transistor QW and an increase in voltage drop at the load RCL by an increase in base current of the transistor QW.

It is an object of the embodiment to provide a semiconductor circuit which can prevent that the voltage of the selected word line drops.

The above object is accomplished by a semiconductor circuit comprising: a bipolar transistor whose emitter is connected to a current source and whose collector is connected to a load; and a switch in which one end is connected to the load and the other end is connected to a base of the transistor, wherein a current flowing to the load is controlled by on/off controlling the switch.

Or, the above object is accomplished by a semiconductor circuit in a current switch comprising: a first bipolar transistor in which a first load is connected to a collector, a first signal voltage is applied to a base, and a current source is connected to an emitter; and a second bipolar transistor in which a second load is connected to a collector, a second signal voltage is applied to a base, and the current source is connected to an emitter, wherein currents flowing to the first and second loads are switched is dependence on the high or low level of the first and second signal voltages, and wherein the semiconductor circuit is characterized in that an MOS transistor in which the collector of the first (or second) transistor is connected to a drain and the collector of the second (or first) transistor is connected to a gate is provided for the current switch.

In the case of applying the first means to the word line discharge circuit, the NPN transistor is used as the bipolar transistor, the switch is turned off when the word line is set to the high voltage, and the switch is turned on when the word line is switched from the high voltage to the low voltage and when the word line is set to the low voltage. With the above construction, since no current flows to the word line when the word line is at the high voltage, the problem such that the voltage of the selected word line drops does not occur. Moreover, when the word line is switched from the high voltage to the low voltage, a discharge current flows, so that the switching speed from the high voltage to the low voltage of the word line can be made fast. Further, in the conventional discharge circuit, since a discharge current is always supplied to the word line when the word line is set to the high voltage, there is an upper limitation in the magnitude of the discharge current due to the voltage drop by the resistance of the word line or a limitation of the electromigration of the wiring. However, according to the discharge circuit of the invention, when the word line is set to the high voltage, no current is supplied to the word line and only when the word line is switched from the high voltage to the low voltage, a large current is supplied. Therefore, the magnitude of the discharge current can be set to a value which is equal to or larger than that of the conventional circuit and the switching speed from the high voltage to the low voltage of the word line can be made fast corresponding to the amount of such a large discharge current.

On the other hand, in the case where the second means is applied to the word line driver and the word line is driven by the collector of the first bipolar transistor, an NPN transistor is used as the bipolar transistor and a PMOS transistor is used as the MOS transistor. With the above construction, when the collector of the first bipolar transistor is set to the high voltage and the word line is set to the high voltage, since the collector of the second bipolar transistor, that is, the gate of the PMOS transistor is set to the low voltage, the PMOS transistor is turned on. On the other hand, since the PMOS transistor is connected in parallel with the first load, even if a base current of the transistor to drive the word line increases, the voltage drop at the first load is extremely small and the problem such that the voltage of the selected word line drops does not occur. Further, since the PMOS transistor is turned on when the word line is switched from the low voltage to the high voltage, the switching speed from the low voltage to the high voltage of the word line can be made fast.

Figure 14:
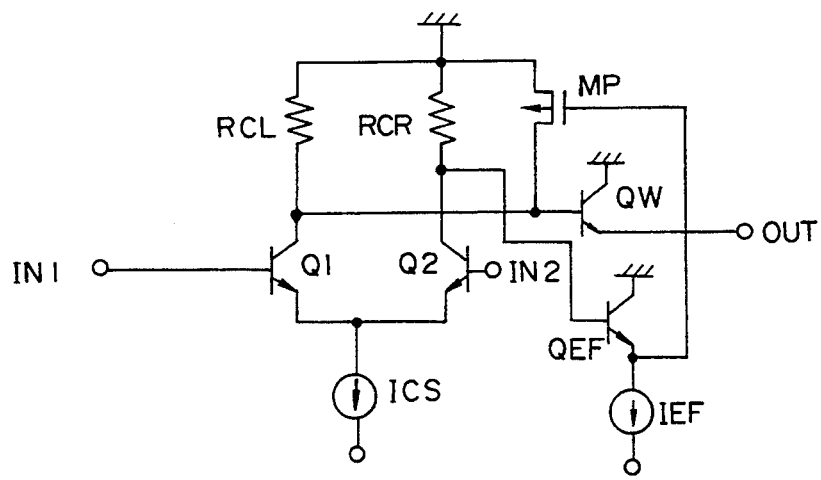
FIG. 14 is a circuit diagram showing an ECL.

On the other hand, the present inventors have already proposed a circuit shown in FIG. 14 in order to prevent the reduction in the output voltage of an ECL (Emitter Coupled Logic) circuit. However, when the circuit shown in FIG. 14 is applied to the word line driver, the current source IEF as many as only the number of word lines are necessary and the electric power consumption increases. On the other hand, since the circuit of the embodiment does not need the current source, the problem such that the electric power consumption increases does not occur.

Figure 12:
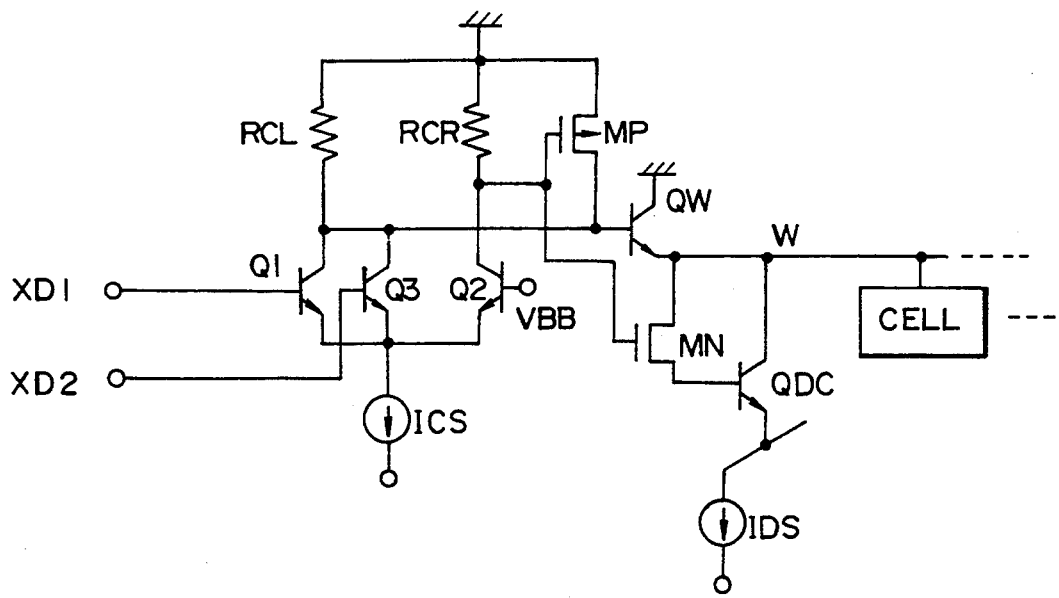
FIG. 12 is a circuit diagram of a word line discharge circuit of a memory and a word line driver showing the twelfth embodiment of the invention.

FIG. 12 is a diagram showing the twelfth embodiment of the invention and shows an example in the case where the semiconductor circuit of the embodiment is applied to the word line discharge circuit of the memory and the word line driver. In the following drawings, $Q_1$ to $Q_3$, QW, and QDC denote bipolar transistors; MP indicates a PMOS transistor; MN, an NMOS transistor; RCL and RCR, the loads; W, a word line; ICS a current for switching current; and IDS the discharge current.

It is the first feature of this embodiment that there are provided the bipolar transistor QDC whose emitter is connected to the current source and whose collector is connected to the word line W and the NMOS transistor whose drain is connected to the word line W and whose source is connected to the base of the transistor QDC and that a current flowing to the word line W is controlled by on/off controlling the MOS transistor MN. In the embodiment, the on/off control of the MOS transistor MN is realized by connecting the gate of the MOS transistor MN to the collector of the transistor $Q_2$. That is, with the above structure, when the word line is set to the high voltage, the MOS transistor MN is turned off, while the MOS transistor MN is turned on when the word line is switched from the high voltage to the low voltage and when the word line is set to the low voltage. Therefore, the problem such that when the word line is set to the high voltage, no current flows to the word line, so that the voltage of the selected word line drops does not occur. Moreover, when the word line is switched from the high voltage to the low voltage, the discharge current flows, so that the switching speed from the high voltage to the low voltage of the word line can be made fast. On the other hand, further, in the conventional discharge circuit, when the word line is set to the high voltage, the discharge current is always supplied to the word line, so that there is an upper limitation in magnitude of the discharge current due to the voltage drop by the resistance of the word line or the limitation of the electromigration of the wiring. However, according to the discharge circuit of the invention, since no current flows to the word line when the word line is set to the high voltage, the magnitude of discharge current can be set to a value which is equal to or large than that of the conventional circuit and the switching speed from the high voltage to the low voltage of the word line can be made fast by the amount of such a large discharge current.

It is the second feature of the embodiment that in the current switch constructing the word line driver, there is provided a PMOS transistor MP in which a collector of the transistor $Q_1$ is connected to a drain and a collector of the transistor $Q_2$ is connected to a gate. With the above structure, when the collector of the transistor $Q_1$ is set to the high voltage and the word line W is set to the high voltage, the collector of the transistor $Q_2$, that is, the gate of the PMOS transistor MP is set to the low voltage, so that the PMOS transistor is turned on. On the other hand, since the PMOS transistor is connected in parallel with the load RCL, even if the base current of the transistor QW to drive the word line increases, the voltage drop at the load RCL is extremely small and the problem such that the voltage of the selected word line W drops does not occur. On the other hand, further, when the word line is switched from the low voltage to the high voltage, the PMOS transistor MP is turned on, so that the switching speed from the low voltage to the high voltage of the word line can be made fast.

Embodiment 13

Figure 15:
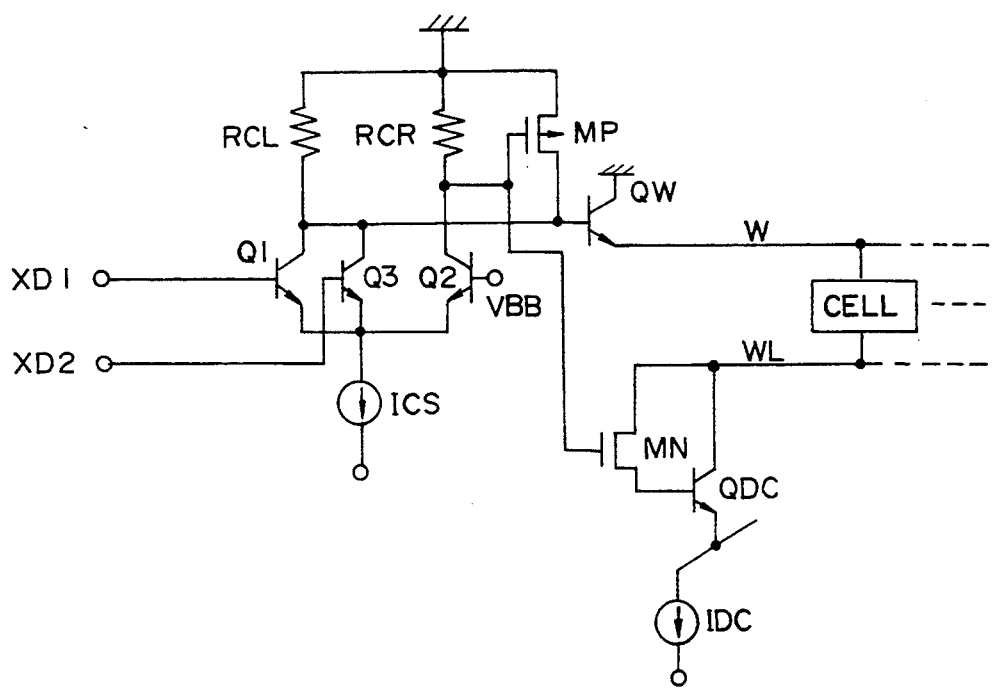
FIGS. 15, 16, and 17 are circuit diagrams of word line discharge circuits of memories and word line drivers showing the thirteenth, fourteenth, and fifteenth embodiments of the invention.

FIG. 15 is a diagram showing the thirteenth embodiment of the invention and shows an example in the case where the semiconductor circuit of this embodiment is applied to the word line discharge circuit of the memory and the word line driver. The thirteenth embodiment differs from the 12th embodiment of FIG. 12 with respect to only a point that in the 12th embodiment, the discharge circuit is added to the upper word line, while in the 13th embodiment, the discharge circuit is added to the lower word line. Therefore, the discussion performed in FIG. 12 is similarly satisfied and the problem such that the voltage of the selected word line drops does not occur. On the other hand, the switching speed from the high voltage to the low voltage of the word line can be made fast. In the 13th embodiment as well, since the PMOS transistor MP is provided, the switching speed from the low voltage to the high voltage of the word line can be made fast.

Embodiment 14

Figure 16:
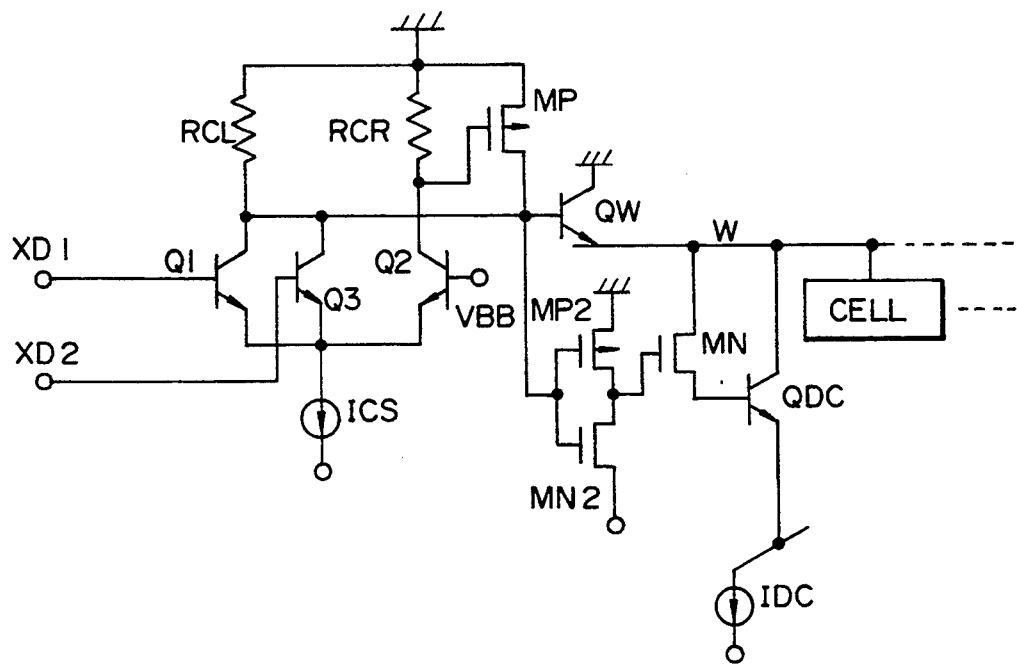

FIG. 16 is a diagram showing the fourteenth embodiment of the invention and shows an example in the case where the semiconductor circuit of this embodiment is applied to the word line discharge circuit of the memory and the word line driver. The 14th embodiment differs from the 12th embodiment of FIG. 12 with respect to only a point that in the 12th embodiment, the on/off control of the NMOS transistor in the discharge circuit has been realized by connecting the gate of the MOS transistor to the collector of the transistor $Q_2$, while in the 14th embodiment, the on/off control of the NMOS transistor is realized by connecting the gate of the MOS transistor to the collector of the transistor $Q_1$ through an inverter comprising MOS transistors $MP_2$ and $MN_2$. Therefore, the discussion performed in FIG. 12 is similarly satisfied and the problem such that the voltage of the selected word line drops does not occur. In addition, the switching speed from the high voltage to the low voltage of the word line can be made fast. On the other hand, even in the 14th embodiment as well, since the PMOS transistor MP is provided, the switching speed from the low voltage to the high voltage of the word line can be made fast.

Embodiment 15

Figure 17:
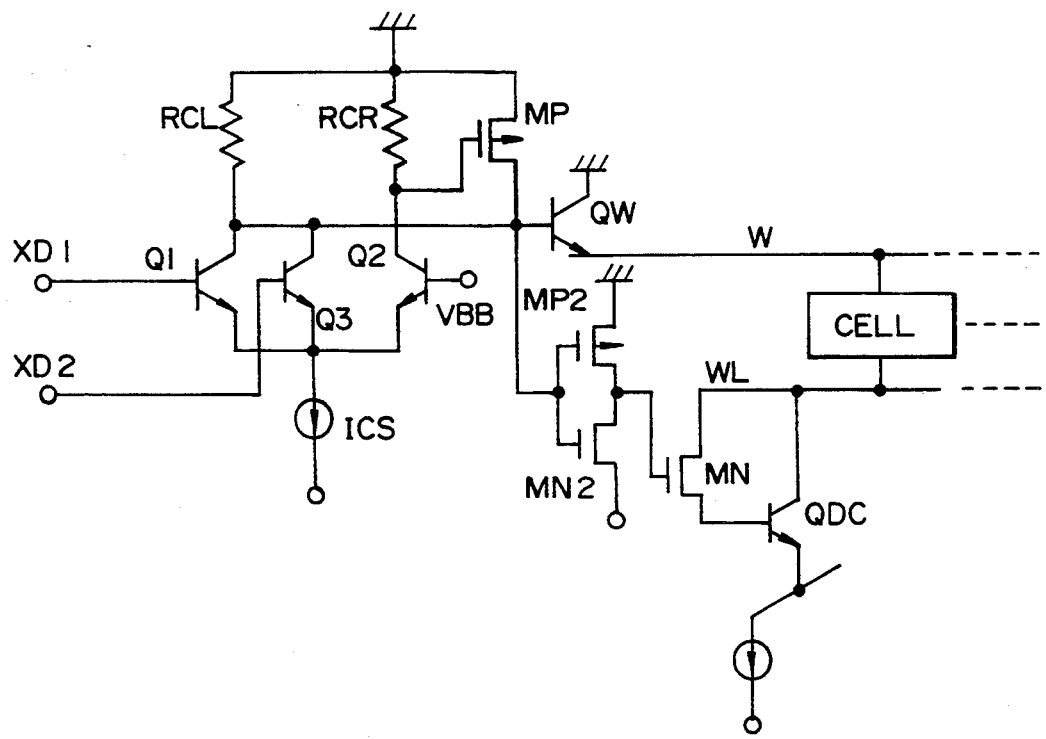

FIG. 17 is a diagram showing the fifteenth embodiment of the invention and shows an example in the case where the semiconductor circuit of this embodiment is applied to the word line discharge circuit of the memory and the word line driver. The 15th embodiment differs from the 14th embodiment of FIG. 16 with respect to only a point that in the 14th embodiment of FIG. 16, the discharge circuit is added to the upper word line, while in the 15th embodiment, the discharge circuit is added to the lower word line. Therefore, the discussion performed in FIG. 12 is similarly satisfied and the problem such that the voltage of the selected word line decreases does not occur. On the other hand, the switching speed from the high voltage to the low voltage of the word line can be made fast. Further, even in the 15th embodiment as well, since the PMOS transistor MP is provided, the switching speed from the low voltage to the high voltage of the word line can be made fast.

As mentioned above, by using the embodiments, the problem such that the voltage of the selected word line drops does not occur. On the other hand, the switching speed from the high voltage to the low voltage of the word line can be made fast. In addition, the switching speed from the low voltage to the high voltage of the word line can be made fast.

Although the examples in which the embodiments are applied to the word line discharge circuit of the memory have been described above, the embodiments are not limited to such examples and can be also similarly applied to a circuit to drive a large load.

Embodiment 16

The sixteenth embodiment relates to a current switch circuit suitable to realize a low power source voltage and a semiconductor memory to which the current switch circuit is applied.

Figure 19A:
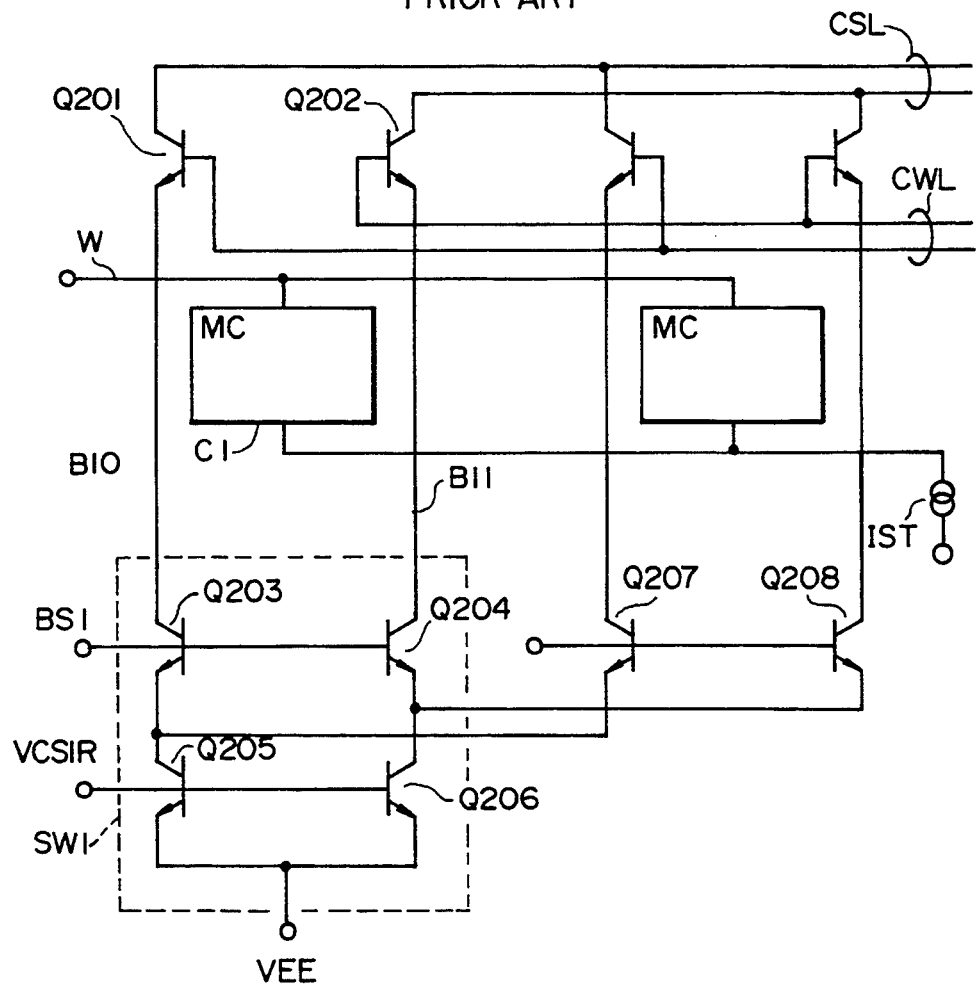
FIGS. 19A and 19B are circuit diagrams showing conventional techniques.

FIG. 19A shows a circuit diagram of another conventional bipolar memory.

In the diagram, $C_1$ denotes a memory cell; W a word line; $B_{10}$ and $B_{11}$ bit lines; IST an information holding current source; $Q_{201}$ and $Q_{202}$ reference transistors serving to read out information of the memory cell; CSL a common sense line which is a common line to transmit the information which was read out by the reference transistor to the sense circuit; CWL a read/write control line which is connected to the base of the reference transistor and controls the reading/writing operation of information of the memory cell; and $SW_1$ a bit line driving current switch circuit which functions so as to supply a driving current to only the selected bit line in accordance with a bit line driving signal $BS_1$.

That is, the bit line driving current switch circuit is constructed by: a current switch comprising transistors $Q_{203}$ and $Q_{207}$ and a current source transistor $Q_{205}$; and a current switch comprising transistors $Q_{204}$ and $Q_{208}$ and a current source transistor $Q_{206}$. Therefore, the driving current flows to only the circuit in which the bit line select signal is set to the high voltage.

On the other hand, in association with the realization of a fine semiconductor device, the withstanding voltage of the elements constructing the semiconductor device is decreasing more and more. Therefore, there is a tendency such that the power source voltage of the semiconductor device is consequentially reduced. However, in the conventional circuit shown in FIG. 19A, in the case where a Darlington driver is used for the word line driver, it is necessary to set the power source voltage to about 5.2 V, and in the case where an emitter follower driver is used, it is necessary to set the power source voltage to about 4.5 V. The low power source voltage lower than such a voltage cannot be accomplished.

Figure 19B:
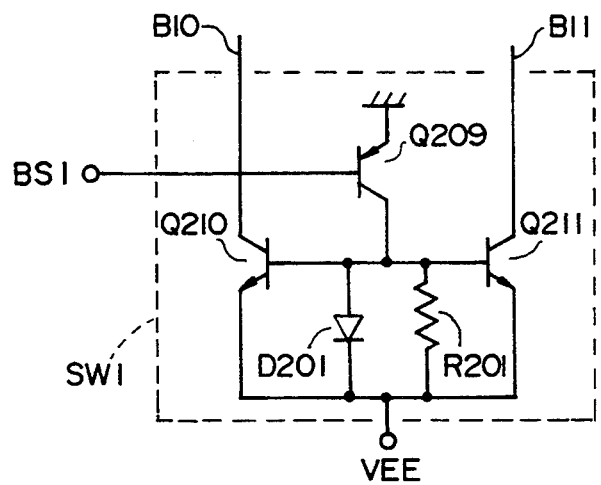

Under such a background, a circuit shown in FIG. 19B (for instance, disclosed in JP-B-60-8554) has been proposed as a bit line driving current switch circuit suitable to realize the low power source voltage of the semiconductor memory.

In the diagram, $SW_1$ denotes the bit line driving current switch circuit which functions so as to supply the driving current to only the selected bit line in accordance with the bit line driving signal $BS_1$.

Consideration will now be made with respect to state in which the bit lines $B_{10}$ and $B_{11}$ are selected and the bit line select signal $BS_1$ is set to the low voltage (in the circuit, the low voltage of the bit line select signal indicates the selection state and the high voltage indicates the non-selection state). In this case, a PNP transistor $Q_{209}$ of the switch circuit $SW_1$ is made conductive and a current is supplied to a diode $D_{201}$. Since the diode $D_{201}$ and the transistors $Q_{210}$ and $Q_{211}$ construct a current Miller circuit, assuming that the areas of those three emitters are equal, the same current as the current flowing through the diode $D_{201}$ flows to transistors $Q_{210}$ and $Q_{211}$ and a driving current is supplied to the bit line.

The bit line driving current switch circuit which is constructed by connecting two transistors in FIG. 19A is realized by a single transistor according to the circuit of the present invention, so that the low power source voltage which is lower by the level of only one transistor can be attained.

However, in the conventional technique of FIG. 19B, it is necessary to use the PNP transistor and there are the following problems.

① The processes become complicated.
② It is difficult to realize a PNP transistor of the high performance.

It is an object of the embodiment to provide a current switch circuit which uses no PNP transistor, that is, which can be easily realized by the existing processing technique and which is suitable to attain a high speed and a low power source voltage.

To accomplish the above object, it is sufficient to construct a current switch circuit to switch an output current in accordance with an input signal by: a logic circuit to generate either a high voltage or a low voltage in accordance with an input signal; a level shift circuit which receives an output voltage of the logic circuit and whose output voltage V satisfies the following equation $$\partial V / \partial VEE = 1 (VEE: \text{power source voltage});$$

and a current source of the current Miller type for switching an output current on the basis of the output voltage of the level shift circuit.

On the other hand, it is also possible to construct the current source of the current Miller type by, for instance: a first transistor in which a load is connected to an emitter; a second transistor whose collector and base are connected to the other end of the load; and a third transistor whose base is connected to the base of the second transistor and whose emitter is connected to the emitter of the second transistor.

On the other hand, it is also possible to construct in a manner such that an anode of a Schottky barrier diode is connected to the base of the second transistor, one end of a resistor is connected to a cathode of the Schottky barrier diode, and the other end of the resistor is connected to the emitter of the second transistor.

The signal potential to drive the current source of the current Miller type can be changed by the level shift circuit so as to follow a fluctuation in power source voltage. Thus, the output current of the current Miller type current source can be held to a predetermined value for a fluctuation in power source voltage. On the other hand, the current switch circuit can be realized by the voltage of a single transistor by the current Miller type current source and the low power source voltage can be attained.

Further, a pull-down circuit in which a Schottky barrier diode and a resistor are serially connected is provided between the base and emitter of the transistor constructing the current Miller. Thus, a driving amplitude of the current Miller type current source can be reduced, the trailing speed of the driving signal can be made fast, and the current switching speed can be made fast.

In the embodiment, since there is no need to use any PNP transistor, the embodiment can be easily realized by the existing processing technique.

From the above techniques, it is possible to provide a current switch circuit which does not use any PNP transistor, that is, which can be easily realized by the existing processing technique and which is suitable to realize a high speed and a low power source voltage.

Figure 18:
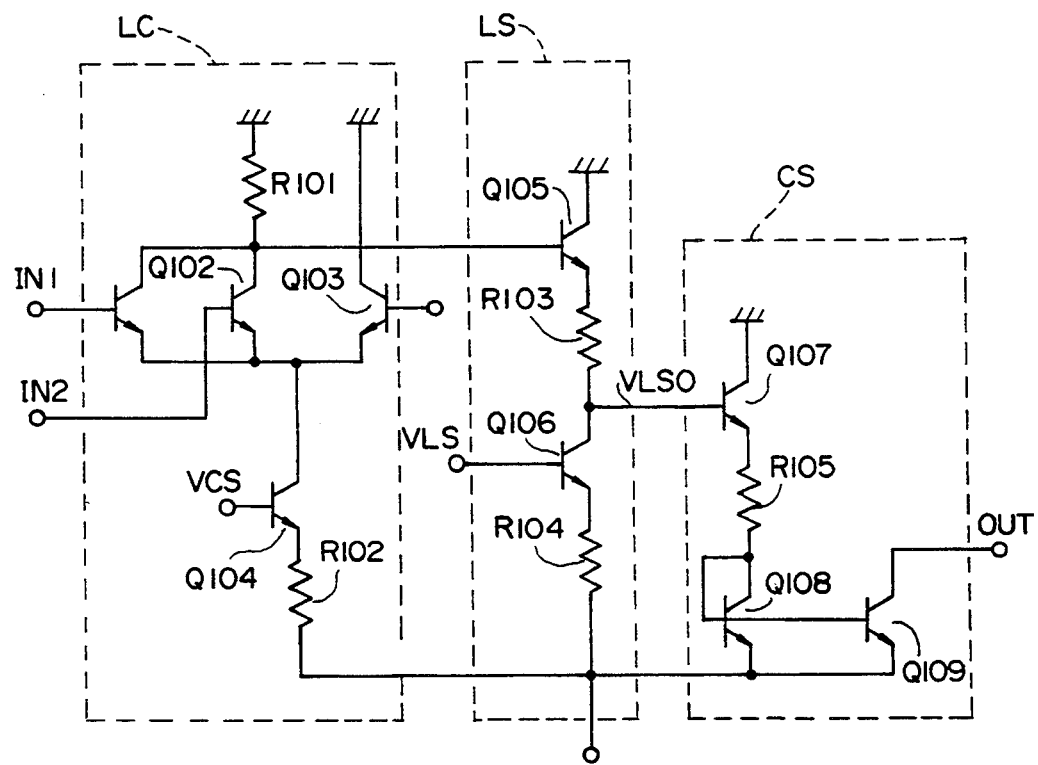
FIG. 18 is a circuit diagram showing the sixteenth embodiment of the invention;.

FIG. 18 shows the sixteenth embodiment of the invention and shows the most fundamental embodiment. In the diagram, W denotes the word line; $B_{10}$ and $B_{11}$ indicate the bit lines; $SW_1$ and $SW_2$ the bit line driving current switch circuits; LC a logic circuit; LS a level shift circuit; and CS a current Miller type current source. The logic circuit LC controls an output current in accordance with input signals $IN_1$ and $IN_2$. The logic circuit LC comprises transistors $Q_{101}$, $Q_{102}$, $Q_{103}$, and $Q_{104}$ and resistors $R_{101}$ and $R_{102}$.

In the 16th embodiment, there is shown an example in which when the input signals $IN_1$ and $IN_2$ are set to the low voltage, a current flows to an output terminal OUT.

The level Shift circuit LS functions so as to shift the level of the output voltage of the logic circuit LC to the optimum voltage suitable to drive the current Miller type current source and to eliminate the dependency of a driving voltage VLSO of the current Miller type current source on the power source voltage (in a manner such that $\partial VLSO/\partial VEE=1$). When the driving voltage VLSO is set to the high voltage, the current Miller type current source CS supplies a current to the output terminal OUT. When the VLSO is set to the low voltage, the current source CS shuts out the current.

The operation of the circuit will now be quantitatively explained hereinbelow.

The case where both of the input signals $IN_1$ and $IN_2$ are at the low voltage will now be considered. In this case, the output voltage VLSO of the level shift circuit is $$VLSO = \qquad (1)$$

$$-\frac{R_{101}}{R_{102}} \cdot (VCS - VBE(Q_{104}) - VEE) - VBE(Q_{105}) -$$

$$\frac{R_{103}}{R_{104}} \cdot (VLS - VBE(Q_{106}) - VEE),$$

where VBE ($Q_{104}$), VBE ($Q_{105}$), VBE ($Q_{106}$):

The output voltage VLSO is set to the base-emitter voltage of the transistors $Q_{104}$, $Q_{105}$, and $Q_{106}$. Now, when internal power source voltages VCS and VLS of the logic circuit LC and level shift circuit LS are set as follows.

$$VCS = \alpha \cdot VBE + VEE \qquad (2)$$

$$VLS = -\beta \cdot VBE \qquad (3)$$

where, $\alpha$ and $\beta$: positive real numbers and when it is designed such that $R_{103}/R_{104}=1$, $$VLSO = -\frac{R_{101}}{R_{102}} (\alpha VBE - VBE(Q_{104})) - VBE(Q_{105}) + \qquad (4)$$

$$(VBE(Q_{106}) + \beta VBE + VEE)$$

That is, $$\frac{\partial VLSO}{\partial VEE} = 1 \qquad (5)$$

can be set. An output current IO of the circuit is $$IO = \frac{VLSO - VBE(Q_{107}) - VBE(Q_{108}) - VEE}{R_{105}} \quad (6)$$

where, VBE ($Q_{107}$) and VBE ($Q_{108}$): base-emitter voltages of transistors $Q_{107}$ and $Q_{108}$, respectively. Therefore, from the equations (5) and (6), $$\frac{\partial IO}{\partial VEE} = 0 \quad (7)$$

is obtained. It will be appreciated that the output current IO can be made constant irrespective of a fluctuation of the power source voltage VEE.

The case where the input signals are switched and the output of the logic circuit LC is set to the low voltage will now be considered. In this case, by designing a signal amplitude of the logic circuit LC in a manner such that the voltage which is applied to a resistor $R_{105}$ is set to almost 0 V, the output current can be shut off.

As mentioned above, the signal voltage to drive the current Miller type current source can be changed by the level shift circuit LS so as to follow a fluctuation in power source voltage. Due to this, the output current of the current Miller type current source can be held to a predetermined value for a fluctuation in power source voltage. On the other hand, the current switch circuit can be realized by the voltage of a single transistor by the current Miller type current source and a low power source voltage can be accomplished. Therefore, according to this embodiment, it is possible to provide a current switch circuit which uses no PNP transistor, that is, which can be easily realized by the existing processing technique and which is suitable to attain a low power source voltage.

In this embodiment, when the delay time in the level shift circuit is long, a speed-up capacitor can be also connected in parallel with the resistor $R_{103}$.

On the other hand, although the embodiment has been described with respect to the example in which the logic circuit LC is realized by an emitter coupled logic by the bipolar transistor, the embodiment is not limited to such an example. The logic circuit LC can be also realized by MOS transistors or by a logic circuit in which a bipolar transistor and an MOS transistor mixedly exist.

Embodiment 17

Figure 20:
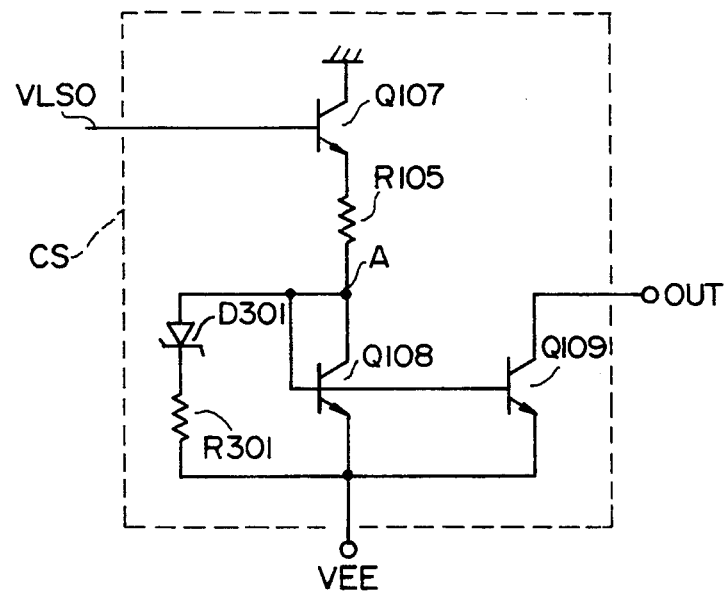
FIG. 20 is a circuit diagram showing an embodiment in which a pull-down circuit is provided.

FIG. 20 shows the seventeenth embodiment of the invention and shows an example in the case where a pull-down circuit is provided for the current Miller type current source. In FIG. 20, only the portion of the current Miller type current source CS is shown. The pull-down circuit is constructed by serially connecting a Schottky barrier diode (hereinafter, referred to as an SBD) $D_{301}$ and a resistor $R_{301}$. A parasitic capacitance at a node A can be discharged at a high speed by the pull-down circuit and an output current can be shut out at a high speed.

On the other hand, even when the driving signal VLSO of the current Miller type current source is set to the low voltage as well, by designing such that a slight current flows to the pull-down circuit, the voltage at the node A is as follows:

VEE+VBE ($Q_{108}$): when VLSO is at the high voltage

VEE+VF ($D_{301}$): when VLSO is at the low voltage where,

VF ($D_{301}$): anode-cathode voltage of SBD $D_{301}$. Therefore, the driving amplitude at the node A can be reduced such that $$VBE(Q_{108}) - VF(D_{301}) \approx 700\ mV - 400\ mV = 300\ mV$$

The current switching can be performed at a high speed.

Embodiment 18

Figure 21:
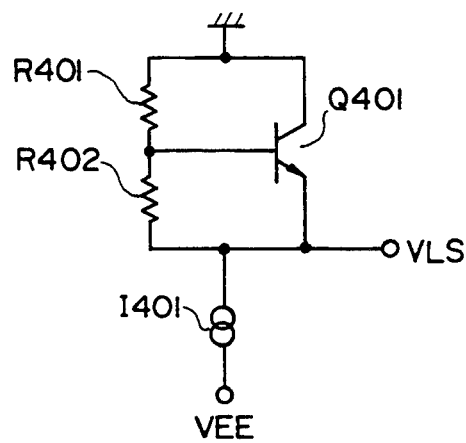
FIG. 21 is a circuit diagram showing an example of an internal power source circuit of a level shift circuit.

FIG. 21 shows the eighteenth embodiment of the invention and shows an example of a circuit to generate an internal power source voltage VLS of the level shift circuit. To keep the output current to a predetermined value for a fluctuation in power source voltage as mentioned above, it is necessary to set such that VLS=$-\beta \cdot$VBE. The circuit keeping such a condition can be realized by a circuit shown in FIG. 21.

In the circuit of the diagram, since VLS is expressed by $$VLS = -\left(\frac{R_{401}}{R_{402}} + 1\right) VBE(Q_{401}) \quad (8)$$

by properly selecting the value of $R_{401}/R_{402}$, the VLS can be designed to an arbitrary voltage.

Embodiment 19

Figure 22:
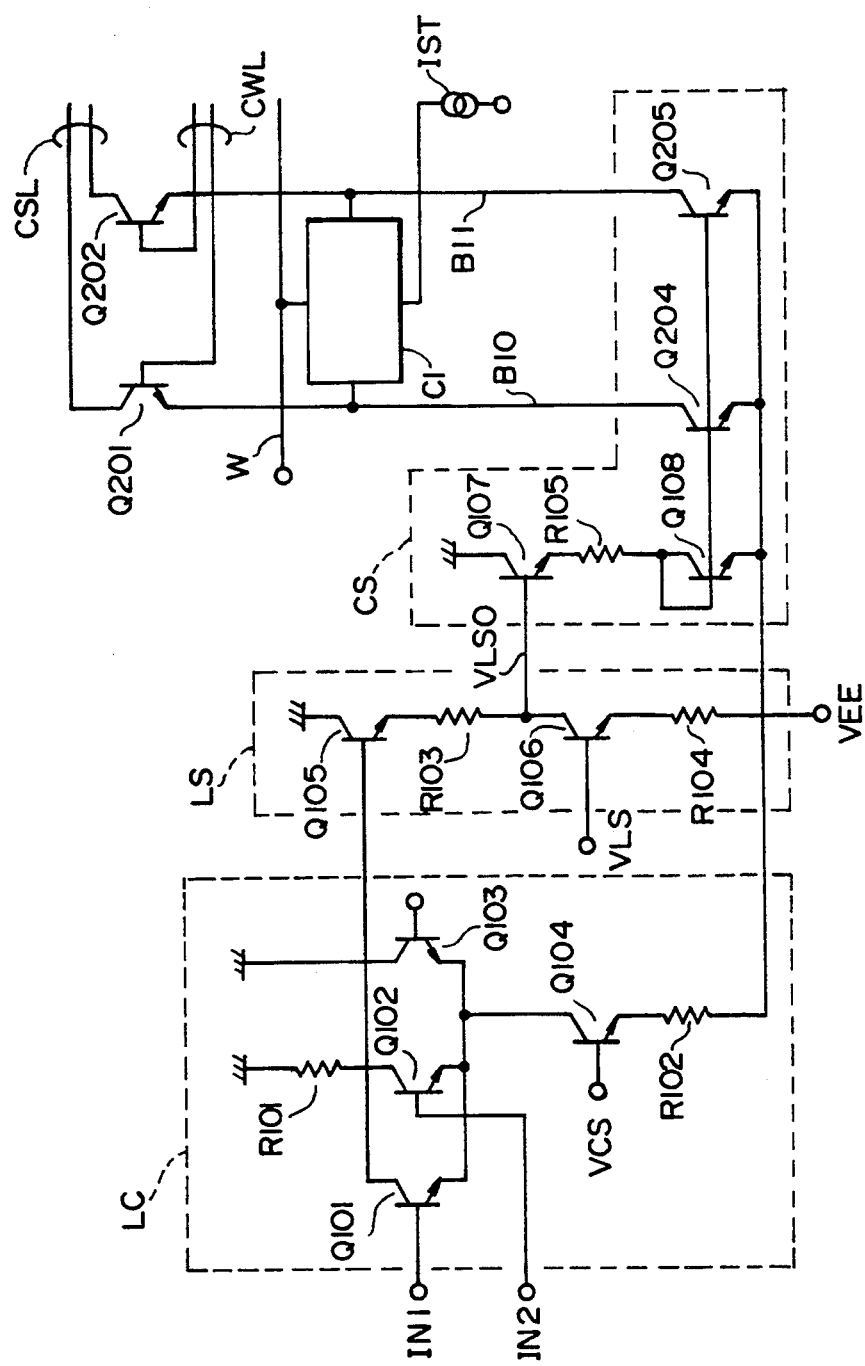
FIG. 22 is a circuit diagram showing an embodiment in which the invention is applied to a semiconductor memory.

FIG. 22 shows the nineteenth embodiment of the invention and shows an example in the case where the invention is applied to a bit line driving current switch circuit of a semiconductor memory.

A signal in which an address input signal was predecoded (for instance, wired OR) is applied to the input signals $IN_1$ and $IN_2$ of the logic circuit LC. When both of the input signals $IN_1$ and $IN_2$ are set to the low voltage, bit line driving currents are supplied from the transistors $Q_{204}$ and $Q_{205}$.

In the 19th embodiment, in a manner similar to the conventional technique of FIG. 19B, the bit line driving current switch circuit can be constructed by one transistor and a low power source voltage of the semiconductor memory can be realized. Moreover, since there is no need to use the PNP transistor as in the conventional technique, the 19th embodiment can be easily realized by the existing processing technique.

Embodiment 20

Figure 23:
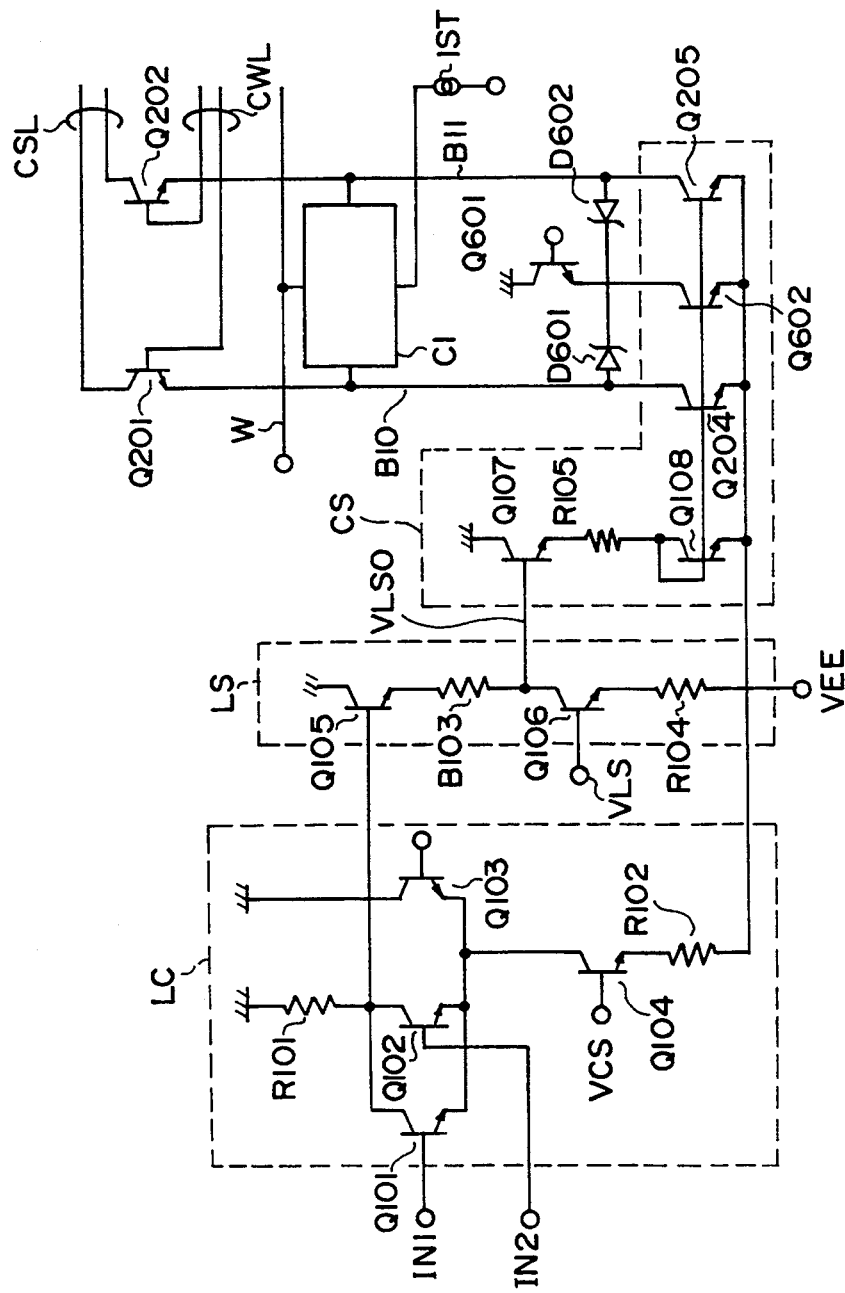
FIG. 23 is a circuit diagram showing an example in which the invention is applied to a semiconductor memory with a bit line discharge circuit.

FIG. 23 shows the twentieth embodiment of the invention and shows an example in the case where the invention is applied to a driving current switch circuit of a semiconductor memory with a bit line discharge circuit. A circuit comprising a transistor $Q_{601}$ and SBDS, $D_{601}$ and $D_{602}$ in the diagram is a bit line discharge circuit.

In the semiconductor memory with the bit line discharge circuit, a collector voltage of the transistor $Q_{602}$ is lower than collector voltages of the transistors $Q_{204}$ and $Q_{205}$ by the level of only the anode-cathode voltage of the SBDS, $D_{601}$ and $D_{602}$. Therefore, in the conventional technique, when a Darlington driver is used for the word line driver, it is difficult to design by $-5.2$ V as a standard power source voltage. However, by applying this embodiment, it is possible to design by the power source voltage of $-5.2$ V and it is possible to largely contribute to attain a high speed of the semiconductor memory.

Embodiment 21

Figure 24:
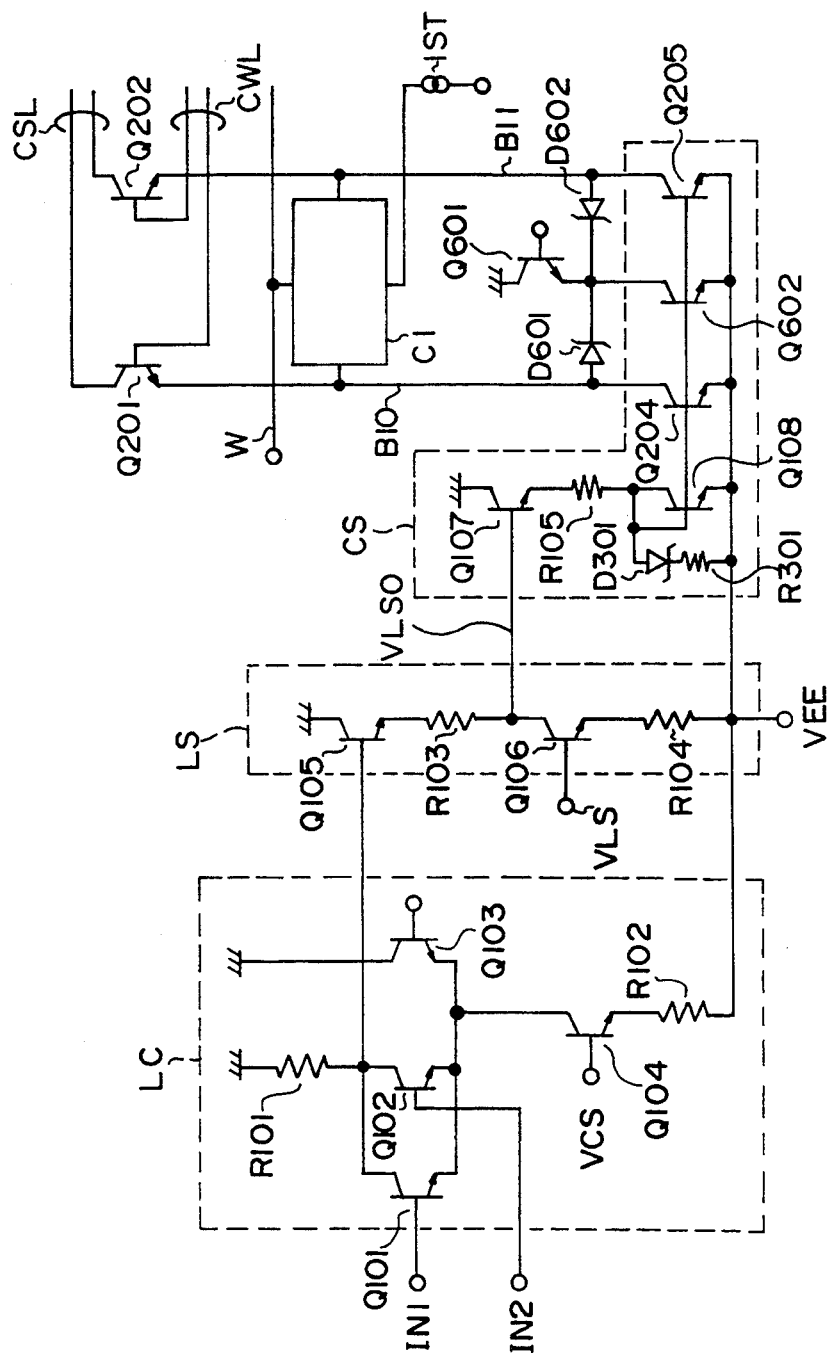
FIG. 24 is a circuit diagram showing an example in which the embodiment of FIG. 20 is applied to a semiconductor memory with a bit line discharge circuit.

FIG. 24 shows the 21st embodiment of the invention and shows an example in the case where the embodiment of FIG. 20 is applied to a semiconductor memory with a bit line discharge circuit. As already mentioned above, the driving amplitude of the current Miller type current source can be reduced by the pull-down circuit comprising an SBD $D_{301}$ and a resistor $R_{301}$ in the diagram and the trailing speed of the driving signal can be made fast. The current switching speed can be made fast. Therefore, according to the circuit, it is possible to provide a semiconductor memory of even higher speed than that in the embodiment of FIG. 23.

As mentioned above, according to the embodiments, it is possible to provide a current switch circuit which uses no PNP transistor, that is, which can be realized by the existing processing technique and which is suitable to attain a high speed and a low power source voltage. On the other hand, by applying the embodiment to the semiconductor memory with a bit line discharge circuit, a high speed semiconductor memory which can be designed by a standard power source voltage can be realized.

As mentioned above, according to the invention, the operating speed of the semiconductor memory can be made fast.

With the invention, the access time when information is read out by switching the selection bit line and the writing time can be extremely made fast.

With the invention, the problem such that the voltage of the selected word line drops does not occur.

On the other hand, according to the invention, the switching speed from the high voltage to the low voltage of the word line can be made fast.

According to the invention, the switching speed from the low voltage to the high voltage of the word line can be made fast.

According to the invention, the charge/discharge time of the bit line when information is written can be reduced and the writing time can be made fast.

According to the invention, if the operating speed is suppressed, a semiconductor memory of low costs can be also provided.

It is further understood by those in the art that the foregoing description is preferred embodiments of the disclosed device and that various changes and modifications may be made in the invention without departing from the spirit and scope thereof.

What is claimed is:

1. A semiconductor memory comprising:
    a plurality of word lines and a plurality of bit line pairs;
    memory cells which are coupled to the word lines and the bit line pairs, wherein each memory cell is arranged between respective crosspoints of a word line and a bit line pair and includes a flip-flop comprised of field effect transistors;
    first bipolar transistors having bases which are coupled to respective bit lines of the bit line pairs, wherein each said first bipolar transistor outputs information of the memory cell, coupled to the same bit line of the bit line pair to which it is coupled, from its collector in accordance with first and second signals which are inputted to their bases and emitters;
    second bipolar transistors having emitters which are coupled to respective bit lines of the bit line pairs, wherein each said second bipolar transistor supplies a charge current to the bit line of the bit line pair to which it is coupled in accordance with third signals which are inputted to their bases; and
    third bipolar transistors having collectors which are coupled to respective bit lines of the bit line pairs, wherein each said third bipolar transistor supplies a discharge current to the bit line of said respective bit lines to which it is coupled in accordance with fourth and fifth signals which are inputted to their bases and their emitters,
    wherein said third signals have higher (lower) potential levels than said fourth signals, and wherein each third bipolar transistor is a bipolar transistor which supplies a current to the bit line of the respective bit lines to which its collector is coupled only when data is being written into a memory cell coupled between the bit line pair to which the third bipolar transistors are coupled.

2. A semiconductor memory according to claim 1, further including fourth bipolar transistors provided corresponding to said respective bit line pairs,
    wherein emitters of the first bipolar transistors coupled to the same bit line pair are commonly coupled to a collector of a fourth bipolar transistor corresponding to the same bit line pair,
    wherein current is supplied to one of the first bipolar transistors in accordance with sixth signals which are inputted to bases of the fourth bipolar transistors, and
    wherein said sixth signals have lower potential levels than said first signals.

3. A semiconductor memory according to claim 2, wherein one constant current source is coupled to emitters of the fourth transistors and another constant current source is coupled to emitters of respective third bipolar transistors.

4. A semiconductor memory according to claim 1, wherein a constant current source is coupled to each bit line.

5. A semiconductor memory according to claim 1, further comprising capacitors, wherein each capacitor has a first plate coupled to a base of a corresponding second bipolar transistor and a second plate coupled to a constant voltage line.

6. A semiconductor memory according to claim 1, further comprising fifth bipolar transistors, wherein each fifth bipolar transistor has an emitter which is coupled to a base of a corresponding second bipolar transistor and a base which is coupled to a constant voltage line.

7. A semiconductor memory according to claim 1, wherein respective bit line pairs comprise adjacent bit lines which are crossed at a midpoint thereof.

8. A semiconductor memory according to claim 1, further having two constant voltage lines,
    wherein said two constant voltage lines are coupled to said memory cells and supply constant voltage thereto, and
    wherein at least one of the two constant voltage lines is laid between the bit line pairs coupled to said memory cells.

9. A semiconductor memory according to claim 1, wherein said fourth signal is selected from the group of signals comprising a read/write control signal, a write data signal, and a logical signal resulting from a boolean operation performed on said read/write control signal and said write data signal.

10. A semiconductor memory according to claim 1, wherein said fifth signal is selected from a group of signals comprising a read/write control signal, a write data signal, and a logical signal resulting from a boolean operation performed on said read/write control signal and said write data signal.

* * * * *